(12) United States Patent
Iacovoni et al.

(10) Patent No.: US 11,903,158 B2
(45) Date of Patent: Feb. 13, 2024

(54) DISPLAY SUPPORT SYSTEM AND METHOD FOR THE USE THEREOF

(71) Applicant: Steelcase Inc., Grand Rapids, MI (US)

(72) Inventors: Joseph Iacovoni, Caledonia, MI (US); Keith Robert Machin, Hopkins, MI (US); Santiago Carral O'Gorman, Grand Rapids, MI (US)

(73) Assignee: STEELCASE INC., Grand Rapids, MI (US)

(*) Notice: Subject to any disclaimer, the term of this patent is extended or adjusted under 35 U.S.C. 154(b) by 190 days.

(21) Appl. No.: 17/517,140

(22) Filed: Nov. 2, 2021

(65) Prior Publication Data

US 2022/0132693 A1 Apr. 28, 2022

Related U.S. Application Data

(63) Continuation of application No. 16/749,650, filed on Jan. 22, 2020, now Pat. No. 11,191,178.

(60) Provisional application No. 62/796,441, filed on Jan. 24, 2019.

(51) Int. Cl.
*F16M 13/02* (2006.01)
*H05K 7/14* (2006.01)
*H05K 5/02* (2006.01)
*H05K 5/00* (2006.01)

(52) U.S. Cl.
CPC ............... *H05K 7/14* (2013.01); *F16M 13/02* (2013.01); *H05K 5/0017* (2013.01); *H05K 5/0221* (2013.01); *H05K 5/0234* (2013.01)

(58) Field of Classification Search
CPC ...... F16M 11/42; F16M 13/02; F16M 11/041; F16M 11/04; F16M 13/022; A47B 97/001; G09F 9/3026; H05K 5/0021
See application file for complete search history.

(56) References Cited

U.S. PATENT DOCUMENTS

| 355,491 A | 1/1887 | Wiley |
| 734,509 A | 7/1903 | Caeser |
| 810,004 A | 1/1906 | Tabler |
| 824,126 A | 6/1906 | Little |
| 930,509 A | 8/1909 | Warfield |

(Continued)

FOREIGN PATENT DOCUMENTS

| AT | 336212 | 4/1977 |
| CN | 103277646 B | 9/2013 |

(Continued)

OTHER PUBLICATIONS

Extended European Search Report for EP Patent Application No. 20745584.1 dated Sep. 22, 2022 (11 pages).

(Continued)

*Primary Examiner* — Bradley Duckworth
(74) *Attorney, Agent, or Firm* — Crowell & Moring LLP

(57) ABSTRACT

A display support system includes a support rail extending in a first direction and at least one support bar carried by the support rail. The support bar is moveable relative to the support rail in at least the first and second directions. A mounting member is engaged with the support bar, with the mounting member being adapted to be coupled to a display. A method for mounting an array of displays on a wall, and a support cart for mounting a display, are also provided.

15 Claims, 36 Drawing Sheets

(56) References Cited

U.S. PATENT DOCUMENTS

| | | |
|---|---|---|
| 1,135,241 A | 4/1915 | Woods |
| 1,487,500 A | 3/1924 | Williams |
| 1,605,506 A | 11/1926 | Brunhoff |
| 1,844,945 A | 2/1932 | Collins |
| 1,955,509 A | 4/1934 | Moeckel |
| 2,058,397 A | 10/1936 | Baker |
| 2,143,235 A | 1/1939 | Bessett |
| 2,187,087 A | 1/1940 | Leary |
| 2,338,968 A | 1/1944 | Robinson et al. |
| 2,417,244 A | 3/1947 | Eggert et al. |
| 2,468,513 A | 4/1949 | Rider |
| 2,520,450 A | 8/1950 | Austin, Jr. |
| 2,599,380 A | 6/1952 | Galvin |
| 2,618,033 A | 11/1952 | Tinnerman et al. |
| 2,833,550 A | 5/1958 | Frick |
| 2,838,351 A | 6/1958 | Siconolfi et al. |
| 2,880,490 A | 4/1959 | Rizzatti et al. |
| 2,902,239 A | 9/1959 | Janecka, Jr. |
| 2,999,570 A | 9/1961 | Seiza |
| 3,476,362 A | 11/1969 | Thompson |
| 3,605,851 A | 9/1971 | Miles et al. |
| 3,735,794 A | 5/1973 | Lebowitz |
| 3,766,692 A | 10/1973 | Stark et al. |
| 3,802,146 A | 4/1974 | Tacke et al. |
| 3,809,142 A | 5/1974 | Bleeker |
| 3,836,144 A | 9/1974 | Mahoney |
| 3,874,035 A | 4/1975 | Schuplin |
| 3,889,315 A | 6/1975 | Stouffer |
| 3,949,827 A | 4/1976 | Witherspoon |
| 3,987,836 A | 10/1976 | Lemay |
| 4,034,463 A | 7/1977 | Ryan |
| 4,036,465 A | 7/1977 | Kellner |
| 4,104,838 A | 8/1978 | Hage et al. |
| 4,190,375 A | 2/1980 | Berry |
| 4,197,685 A | 4/1980 | Goulish et al. |
| 4,213,493 A | 7/1980 | Haworth |
| 4,215,765 A | 8/1980 | Harris |
| D262,183 S | 12/1981 | Brown et al. |
| 4,344,719 A | 8/1982 | Thom |
| 4,383,487 A | 5/1983 | Fitzner et al. |
| 4,398,841 A | 8/1983 | Kojima et al. |
| 4,523,722 A | 6/1985 | Cohen et al. |
| 4,559,738 A | 12/1985 | Helfman |
| 4,635,410 A | 1/1987 | Chumbley |
| 4,644,876 A | 2/1987 | Thomas |
| 4,671,481 A | 6/1987 | Beard |
| 4,684,425 A | 8/1987 | Bannister |
| 4,711,183 A | 12/1987 | Handler et al. |
| 4,740,010 A | 4/1988 | Moszkovitz |
| 4,755,260 A | 10/1988 | Kecmer |
| 4,824,064 A | 4/1989 | Oncale |
| 4,928,116 A | 5/1990 | Wood |
| 4,929,116 A | 5/1990 | Mahl |
| 4,934,015 A | 6/1990 | Mink |
| 4,947,601 A | 8/1990 | McGuire |
| 4,971,281 A | 11/1990 | Steinbeck |
| 4,989,688 A | 2/1991 | Nelson |
| 4,991,368 A | 2/1991 | Amstutz |
| D318,608 S | 7/1991 | Schenker |
| 5,058,331 A | 10/1991 | Epps |
| 5,083,390 A | 1/1992 | Edman |
| 5,101,606 A | 4/1992 | Meru |
| 5,129,202 A | 7/1992 | Payne et al. |
| 5,141,192 A | 8/1992 | Adams |
| 5,162,696 A | 11/1992 | Goodrich |
| 5,164,853 A | 11/1992 | Shimazaki |
| 5,394,658 A | 3/1995 | Schriener et al. |
| 5,413,408 A | 5/1995 | Beck et al. |
| 5,419,522 A | 5/1995 | Luecke et al. |
| 5,501,423 A | 3/1996 | Roberts |
| 5,511,348 A | 4/1996 | Cornell et al. |
| 5,640,823 A | 6/1997 | Bergeron et al. |
| 5,647,152 A | 7/1997 | Miura |
| 5,806,943 A | 9/1998 | Dell et al. |
| 5,820,289 A | 10/1998 | Kern et al. |
| 5,867,236 A | 2/1999 | Babuka et al. |
| 5,875,578 A | 3/1999 | Grewe |
| 5,878,518 A | 3/1999 | Grewe |
| D408,716 S | 4/1999 | Vesledahl |
| 5,899,035 A | 5/1999 | Waalkes et al. |
| 5,921,402 A | 7/1999 | Magenheimer |
| 5,941,713 A | 8/1999 | Wayner et al. |
| 5,970,669 A | 10/1999 | Livingston |
| 6,003,803 A | 12/1999 | Knapp et al. |
| 6,029,833 A | 2/2000 | Yeh |
| 6,050,033 A | 4/2000 | Wrightman |
| 6,079,173 A | 6/2000 | Waalkes et al. |
| 6,092,771 A | 7/2000 | Fich |
| 6,112,472 A | 9/2000 | Van Dyk et al. |
| 6,116,326 A | 9/2000 | Domina et al. |
| 6,129,101 A | 10/2000 | Dubinsky |
| 6,134,844 A | 10/2000 | Cornell et al. |
| 6,141,926 A | 11/2000 | Rossiter et al. |
| 6,173,933 B1 | 1/2001 | Whiteside et al. |
| 6,240,687 B1 | 6/2001 | Chong |
| 6,257,797 B1 | 7/2001 | Lange |
| 6,272,779 B1 | 8/2001 | Seiber et al. |
| 6,337,724 B1 | 1/2002 | Itoh et al. |
| 6,349,516 B1 | 2/2002 | Powell et al. |
| 6,357,960 B1 | 3/2002 | Cornelius et al. |
| 6,490,829 B1 | 12/2002 | Schreiner et al. |
| 6,505,801 B2 | 1/2003 | Zerres |
| 6,530,545 B2 | 3/2003 | Deciry et al. |
| 6,556,762 B1 | 4/2003 | Erickson et al. |
| 6,561,366 B2 | 5/2003 | Kim-So |
| 6,615,523 B1 | 9/2003 | Curbelo et al. |
| 6,639,643 B2 | 10/2003 | Babuka et al. |
| D482,269 S | 11/2003 | Martello |
| 6,643,942 B1 | 11/2003 | Russell |
| 6,647,652 B1 | 11/2003 | Seiber et al. |
| 6,681,529 B1 | 1/2004 | Baloga et al. |
| 6,719,260 B1 | 4/2004 | Hart |
| 6,729,085 B2 | 5/2004 | Newhouse et al. |
| 6,732,660 B2 | 5/2004 | Dane et al. |
| 6,802,480 B1 | 10/2004 | Martello |
| 6,874,971 B2 | 4/2005 | Albaugh |
| 6,877,442 B2 | 4/2005 | Helle |
| 6,880,259 B1 | 4/2005 | Schultz |
| 6,918,212 B1 | 7/2005 | Anderson, Sr. |
| 6,935,523 B2 | 8/2005 | Ahn |
| 6,955,130 B2 | 10/2005 | Phillips |
| 7,007,903 B2 | 3/2006 | Turner |
| 7,007,905 B2 | 3/2006 | Roberts |
| 7,026,551 B2 | 4/2006 | Franz et al. |
| 7,097,143 B2 | 8/2006 | Kim et al. |
| D529,792 S | 10/2006 | Klein et al. |
| 7,121,796 B2 | 10/2006 | Burdgick et al. |
| D539,636 S | 4/2007 | Bremmon |
| 7,226,024 B2 | 6/2007 | Lin |
| 7,232,234 B2 | 6/2007 | Branham et al. |
| 7,243,892 B2 | 7/2007 | Pfister |
| 7,249,624 B2 | 7/2007 | Zeh et al. |
| 7,317,613 B2 | 1/2008 | Quijano et al. |
| 7,325,343 B2 | 2/2008 | Seiber et al. |
| 7,404,535 B2 | 7/2008 | Mossman et al. |
| 7,455,278 B2 | 11/2008 | Hsu |
| D598,272 S | 8/2009 | Tejszerski |
| 7,584,563 B2 | 9/2009 | Hillstrom et al. |
| 7,611,109 B2 | 11/2009 | Lin |
| 7,621,544 B2 | 11/2009 | Rossini |
| D608,183 S | 1/2010 | Meyer et al. |
| 7,661,640 B2 | 2/2010 | Persson |
| 7,677,519 B2 * | 3/2010 | Gauer .................. A47B 23/007 248/397 |
| 7,708,252 B2 | 5/2010 | Vander Berg et al. |
| 7,748,196 B2 | 7/2010 | Gula et al. |
| 7,797,869 B2 | 9/2010 | Tollis et al. |
| 7,823,857 B2 | 11/2010 | Stengel et al. |
| 7,827,920 B2 | 11/2010 | Beck et al. |
| 7,856,732 B2 | 12/2010 | Townsend et al. |
| 7,862,341 B2 | 1/2011 | Durand et al. |
| 7,871,048 B2 | 1/2011 | Sculler |
| 7,882,600 B2 | 2/2011 | Judd |
| 7,891,614 B2 | 2/2011 | Czajor |

(56) References Cited

U.S. PATENT DOCUMENTS

| | | |
|---|---|---|
| 7,922,133 B2 | 4/2011 | Hsu |
| 7,934,596 B1 | 5/2011 | Aycock |
| 7,941,951 B2 | 5/2011 | Hillstrom et al. |
| 7,996,980 B2 | 8/2011 | Hillstrom et al. |
| 8,007,121 B2 | 8/2011 | Elliott et al. |
| 8,070,121 B2 | 12/2011 | Dozier et al. |
| 8,087,180 B1 | 1/2012 | Clayton |
| 8,104,205 B2 | 1/2012 | Hillstrom et al. |
| D657,054 S | 4/2012 | Bacon |
| D663,190 S | 7/2012 | Mota et al. |
| 8,220,758 B2 | 7/2012 | Czajor |
| 8,245,992 B2 | 8/2012 | Matsui |
| 8,250,774 B2 | 8/2012 | Townsend et al. |
| 8,267,366 B2 | 9/2012 | Cheng |
| 8,276,864 B2 | 10/2012 | Ye et al. |
| 8,286,977 B2 | 10/2012 | Butler et al. |
| 8,333,355 B2 | 12/2012 | Stifal |
| 8,376,581 B2 | 2/2013 | Auld et al. |
| 8,439,323 B1 | 5/2013 | Bae et al. |
| 8,451,594 B2 | 5/2013 | Kim |
| 8,474,835 B1 | 7/2013 | Rossi |
| 8,550,415 B2 | 10/2013 | Sculler |
| D699,549 S | 2/2014 | Giessmann et al. |
| D700,406 S | 2/2014 | Ashbreck |
| 8,667,742 B2 | 3/2014 | Bates et al. |
| 8,690,111 B2 | 4/2014 | Huang |
| 8,696,229 B2 | 4/2014 | Tran |
| 8,727,290 B1 | 5/2014 | De La Matta et al. |
| 8,746,635 B2 | 6/2014 | Kim |
| 8,757,819 B2 * | 6/2014 | MacDonald ............ F16M 11/18 353/74 |
| 8,824,166 B2 | 9/2014 | Rohrbach |
| 8,833,713 B2 | 9/2014 | Kitaguchi |
| 8,910,804 B2 | 12/2014 | Kim et al. |
| 8,947,869 B2 | 2/2015 | Tsai et al. |
| 8,979,049 B2 | 3/2015 | Yoshida |
| 9,003,683 B1 | 4/2015 | Feliciano et al. |
| 9,013,367 B2 | 4/2015 | Cope |
| 9,039,016 B2 | 5/2015 | Abernethy et al. |
| 9,058,755 B2 | 6/2015 | Cope et al. |
| 9,066,589 B2 * | 6/2015 | Battey .................... A47B 41/00 |
| 9,071,809 B2 | 6/2015 | Cope et al. |
| 9,097,008 B2 | 8/2015 | Jung et al. |
| 9,109,742 B2 | 8/2015 | Smith |
| 9,119,303 B2 | 8/2015 | Baik et al. |
| 9,119,487 B2 | 9/2015 | Angvall et al. |
| 9,140,405 B2 | 9/2015 | Prince et al. |
| 9,159,707 B2 | 10/2015 | Cope |
| 9,166,385 B2 | 10/2015 | Newman |
| D744,187 S | 11/2015 | Behar et al. |
| 9,175,801 B2 | 11/2015 | Adilman et al. |
| 9,189,015 B2 | 11/2015 | Tseng et al. |
| 9,255,440 B2 | 2/2016 | Alexander et al. |
| 9,261,122 B2 | 2/2016 | Choy |
| 9,262,947 B2 | 2/2016 | Ranger |
| 9,279,573 B1 | 3/2016 | Perez-Bravo et al. |
| 9,322,507 B2 | 4/2016 | Lucas |
| 9,377,153 B2 | 6/2016 | Zhang et al. |
| 9,377,154 B2 | 6/2016 | Hung et al. |
| 9,377,156 B2 | 6/2016 | Wong |
| 9,386,860 B2 | 7/2016 | Brannan |
| 9,388,933 B2 | 7/2016 | Zhang et al. |
| 9,404,644 B1 | 8/2016 | Perez-Bravo et al. |
| 9,406,248 B2 | 8/2016 | Dalton |
| 9,430,181 B2 | 8/2016 | Dunn et al. |
| 9,435,518 B2 | 9/2016 | Cope et al. |
| 9,448,757 B2 | 9/2016 | Kim et al. |
| 9,449,538 B2 | 9/2016 | Davis et al. |
| 9,474,369 B1 | 10/2016 | Tsai |
| 9,532,663 B2 | 1/2017 | Nilsson |
| 9,535,649 B2 | 1/2017 | Cope et al. |
| 9,567,776 B2 | 2/2017 | Moock et al. |
| 9,605,793 B2 | 3/2017 | Shibata |
| 9,625,091 B1 | 4/2017 | Massey |
| 9,640,516 B2 | 5/2017 | Cope |
| 9,695,872 B2 | 7/2017 | Higashi |
| 9,695,972 B1 | 7/2017 | Jiang et al. |
| 9,695,992 B2 | 7/2017 | Schadt et al. |
| 9,709,215 B2 | 7/2017 | Yoo et al. |
| 9,741,270 B2 | 8/2017 | Zaccai et al. |
| 9,754,518 B2 | 9/2017 | Perez-Bravo et al. |
| 9,782,004 B2 | 10/2017 | Yu et al. |
| 9,831,223 B2 | 11/2017 | Cope |
| 9,854,701 B2 | 12/2017 | Choi et al. |
| 9,894,988 B2 | 2/2018 | Olander |
| 10,328,748 B1 * | 6/2019 | Kim ...................... B60B 33/0015 |
| 10,793,177 B2 * | 10/2020 | Vanti ........................ G06F 3/147 |
| 10,820,434 B2 * | 10/2020 | Choi ..................... F16M 11/105 |
| 2001/0030272 A1 | 10/2001 | Veazey |
| 2002/0011193 A1 | 1/2002 | Beck et al. |
| 2002/0011544 A1 | 1/2002 | Bosson |
| 2002/0047073 A1 | 4/2002 | Deciry et al. |
| 2002/0056794 A1 | 5/2002 | Ibrahim |
| 2002/0124426 A1 | 9/2002 | Dewberry |
| 2003/0029972 A1 | 2/2003 | Rodgers |
| 2003/0066936 A1 | 4/2003 | Beck et al. |
| 2003/0163958 A1 | 9/2003 | Zeh et al. |
| 2004/0216911 A1 | 11/2004 | Franz et al. |
| 2005/0201087 A1 | 9/2005 | Ward |
| 2006/0016735 A1 | 1/2006 | Ito et al. |
| 2006/0204675 A1 | 9/2006 | Gao et al. |
| 2006/0291152 A1 | 12/2006 | Bremmon |
| 2007/0007412 A1 | 1/2007 | Wang |
| 2007/0018062 A1 | 1/2007 | Calinescu |
| 2008/0073471 A1 | 3/2008 | Beger |
| 2008/0083865 A1 | 4/2008 | Matsui |
| 2008/0156949 A1 | 7/2008 | Sculler et al. |
| 2008/0190951 A1 | 8/2008 | Gallagher et al. |
| 2008/0297015 A1 | 12/2008 | Hagar et al. |
| 2008/0315734 A1 * | 12/2008 | Birsel .................... A47B 67/04 312/352 |
| 2009/0002723 A1 | 1/2009 | Kamiyama et al. |
| 2009/0057501 A1 * | 3/2009 | Huang .................. F16M 11/22 248/157 |
| 2009/0101777 A1 | 4/2009 | Kim |
| 2009/0206214 A1 | 8/2009 | David |
| 2009/0252570 A1 | 10/2009 | Lee |
| 2009/0266958 A1 | 10/2009 | Meersman et al. |
| 2010/0006715 A1 * | 1/2010 | Wills ..................... F16M 11/42 248/163.1 |
| 2010/0011602 A1 | 1/2010 | Houssian et al. |
| 2010/0038501 A1 | 2/2010 | Oh |
| 2010/0176266 A1 | 7/2010 | Minkley et al. |
| 2010/0271287 A1 | 10/2010 | Bourne et al. |
| 2010/0309615 A1 | 12/2010 | Grey |
| 2011/0079687 A1 | 4/2011 | Grove |
| 2011/0101179 A1 | 5/2011 | Fritch |
| 2011/0233346 A1 | 9/2011 | Schluter |
| 2011/0260026 A1 | 10/2011 | Ye et al. |
| 2012/0162870 A1 | 6/2012 | MacDonald et al. |
| 2012/0261362 A1 * | 10/2012 | Skull ..................... F16M 11/22 248/225.11 |
| 2013/0075551 A1 | 3/2013 | Stifal et al. |
| 2013/0168335 A1 | 7/2013 | Gillespie |
| 2013/0206943 A1 | 8/2013 | Molter |
| 2013/0243231 A1 | 9/2013 | Parraga Gimeno |
| 2013/0256487 A1 | 10/2013 | Ko |
| 2013/0306816 A1 | 11/2013 | Yoshida |
| 2014/0026788 A1 | 1/2014 | Kallio, III et al. |
| 2014/0138506 A1 | 5/2014 | Dahl et al. |
| 2014/0265193 A1 | 9/2014 | Stark |
| 2014/0360412 A1 | 12/2014 | Zaccai et al. |
| 2016/0115732 A1 | 4/2016 | Alexander et al. |
| 2016/0120309 A1 | 5/2016 | Brandt et al. |
| 2016/0210886 A1 | 7/2016 | Brashnyk et al. |
| 2016/0328532 A1 | 11/2016 | Rieder et al. |
| 2017/0059087 A1 | 3/2017 | Lam et al. |
| 2017/0186345 A1 | 6/2017 | Hemphill et al. |
| 2017/0261154 A1 | 9/2017 | Feldman |
| 2017/0345350 A1 | 11/2017 | Topousis et al. |
| 2018/0252357 A1 | 9/2018 | Kahn |
| 2019/0203875 A1 * | 7/2019 | Yu ......................... F16M 11/42 |
| 2020/0205305 A1 | 6/2020 | Kim |
| 2020/0245488 A1 | 7/2020 | Iacovoni et al. |

(56) References Cited

U.S. PATENT DOCUMENTS

| | | | |
|---|---|---|---|
| 2020/0412998 A1 | 12/2020 | Bremmon | |
| 2021/0247015 A1* | 8/2021 | Yamada | F16M 11/22 |
| 2021/0352811 A1* | 11/2021 | Zhou | F16M 11/38 |

FOREIGN PATENT DOCUMENTS

| | | |
|---|---|---|
| CN | 204309378 U | 5/2015 |
| CN | 204423716 U | 6/2015 |
| CN | 20571981 U | 7/2016 |
| CN | 105743030 A | 7/2016 |
| CN | 205535961 U | 8/2016 |
| CN | 206831093 U | 1/2018 |
| DE | 29 50 742 A1 | 6/1981 |
| DE | 3617445 A1 | 5/1988 |
| DE | 9312696 U1 | 1/1995 |
| DE | 296 17 770 U1 | 1/1997 |
| DE | 299 13 965 U1 | 12/1999 |
| DE | 198 38 722 A1 | 3/2000 |
| DE | 200 17 972 U1 | 2/2001 |
| DE | 199 51 695 A1 | 5/2001 |
| DE | 20 2010 009 779 U1 | 10/2010 |
| DE | 102014107965 A1 | 12/2015 |
| DE | 10 2014 112 177 A1 | 3/2016 |
| DE | 10 2015 010 162 A1 | 2/2017 |
| DE | 10 2009 011 845 B4 | 7/2017 |
| EP | 0 050 241 B1 | 4/1982 |
| EP | 1 134 325 A1 | 9/2001 |
| EP | 2 083 208 B1 | 6/2011 |
| EP | 2 369 219 A2 | 9/2011 |
| FR | 2464342 | 8/1979 |
| FR | 2 694 608 B1 | 2/1994 |
| GB | 654890 | 7/1951 |
| GB | 936145 | 9/1963 |
| GB | 1124359 | 8/1968 |
| GB | 2 129 028 A | 5/1984 |
| GB | 2 443 159 A | 4/2008 |
| GB | 2 528 029 A | 1/2016 |
| JP | 11201386 | 7/1999 |
| JP | 2016109147 A | 6/2016 |
| KR | 10-0930603 | 12/2009 |
| KR | 10 169 9669 | 1/2017 |
| NL | 2011365 | 9/2013 |
| SE | 355 647 | 4/1973 |
| WO | WO 2004/044471 A1 | 5/2004 |
| WO | WO 2011/133120 A1 | 10/2011 |
| WO | WO 2012/023898 A1 | 2/2012 |
| WO | WO 2015/161761 A1 | 10/2015 |
| WO | WO 2016/178621 A1 | 11/2016 |
| WO | WO 2016/178625 A1 | 11/2016 |
| WO | WO 2019/063960 A1 | 4/2019 |

OTHER PUBLICATIONS

International Search Report and Written Opinion for International Application No. PCT/US21/41386 dated Nov. 22, 2021 (14 pages).
International Search Report and Written Opinion for related case No. PCT/US20/14589, dated Jun. 12, 2020, 24 pgs.

* cited by examiner

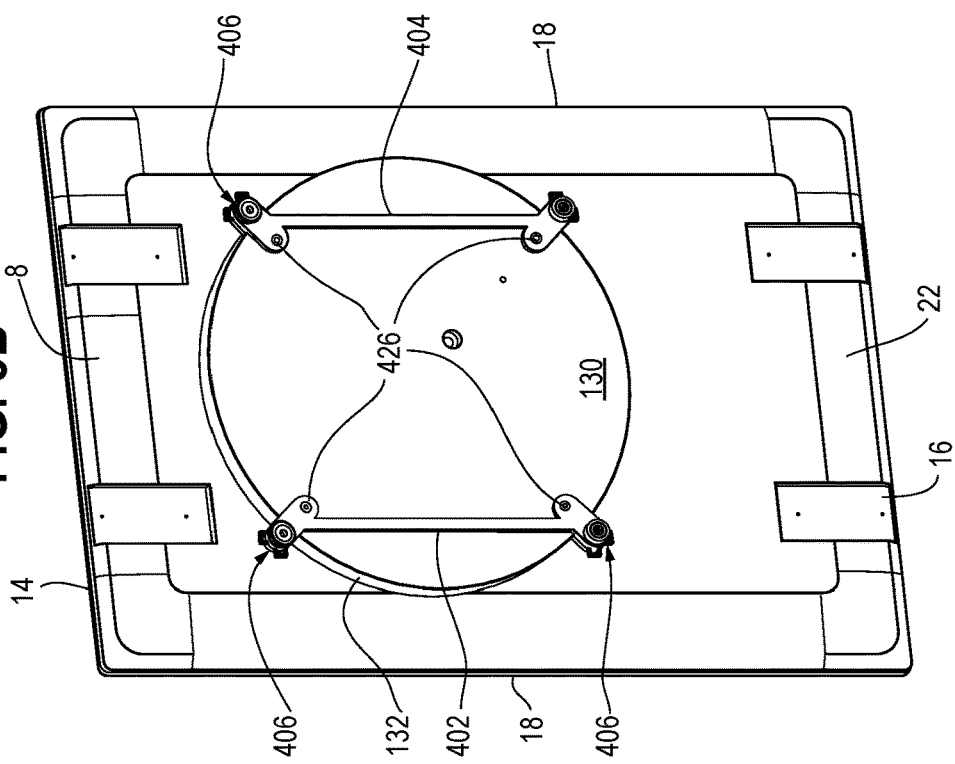
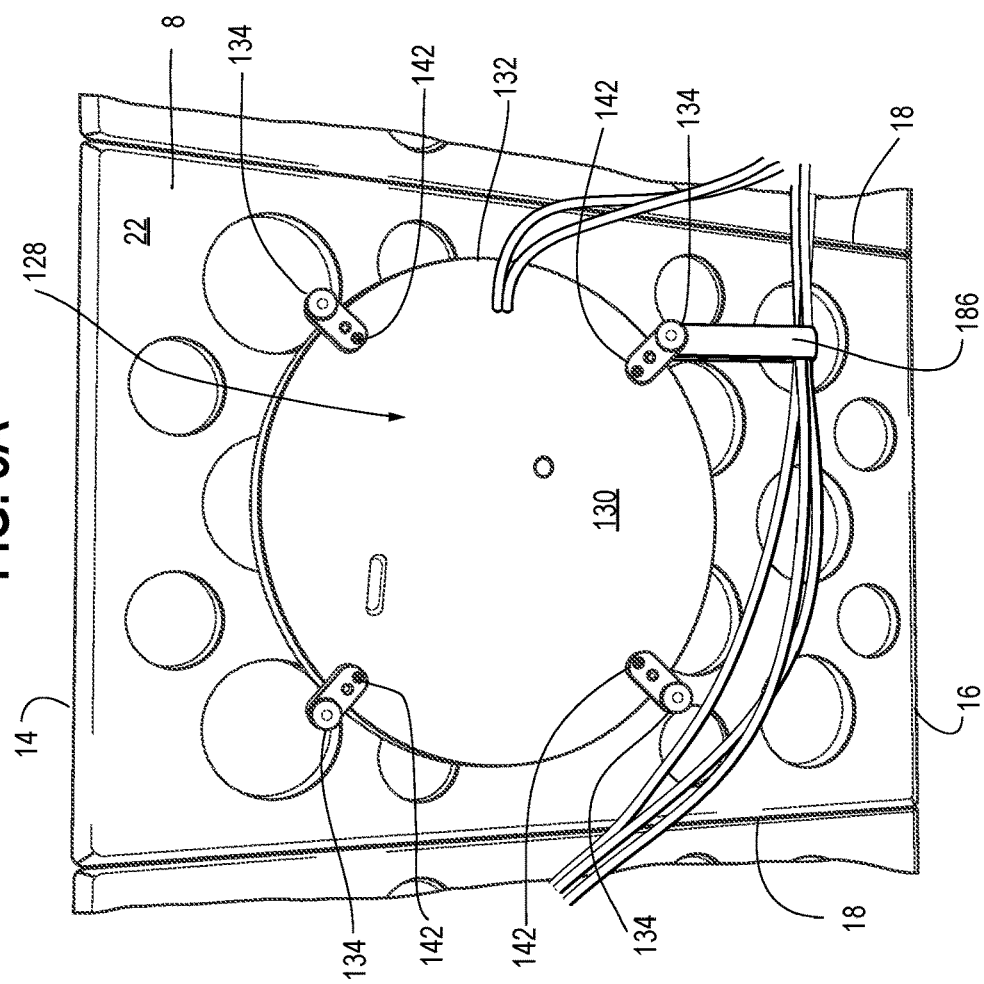

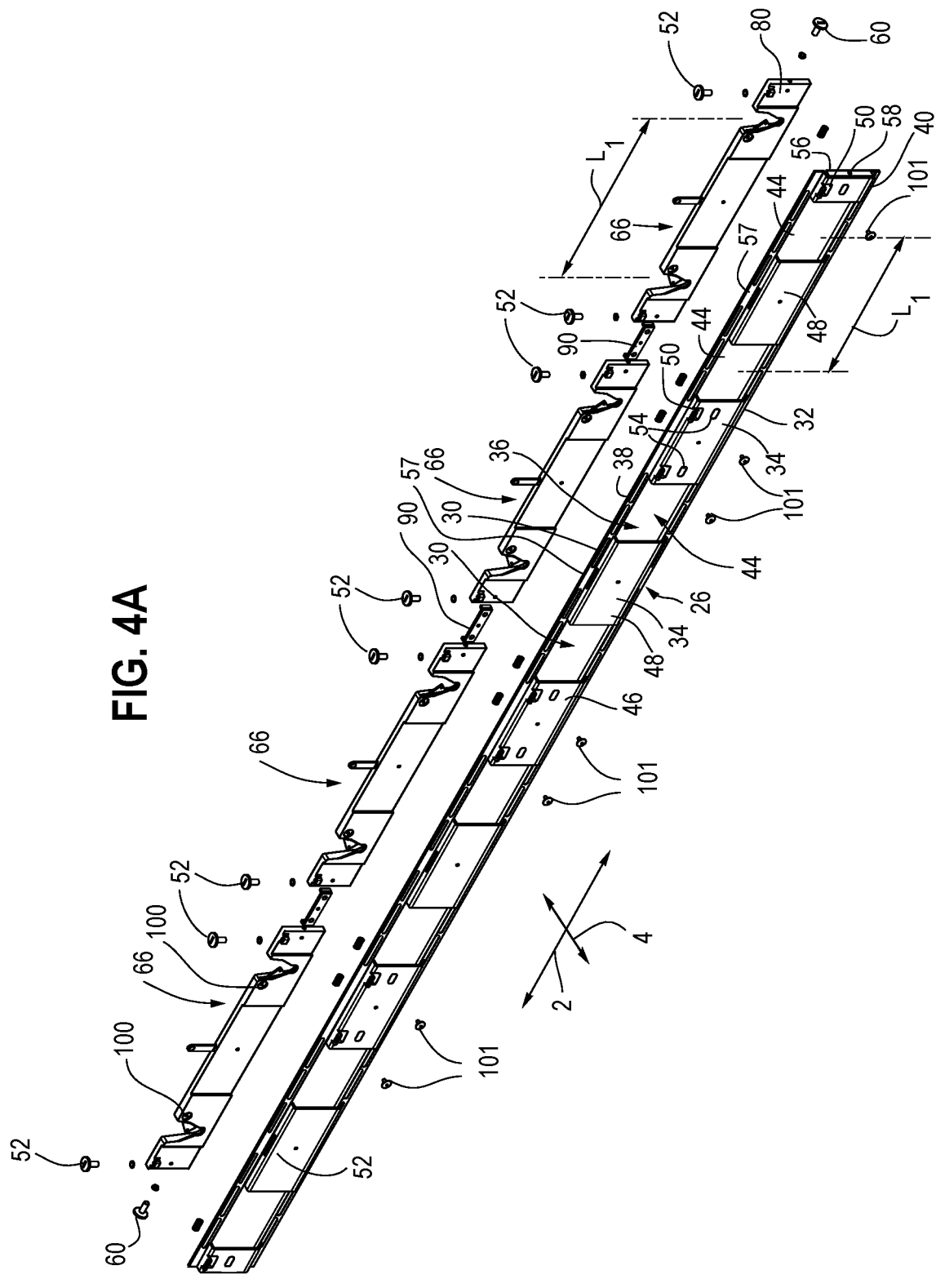

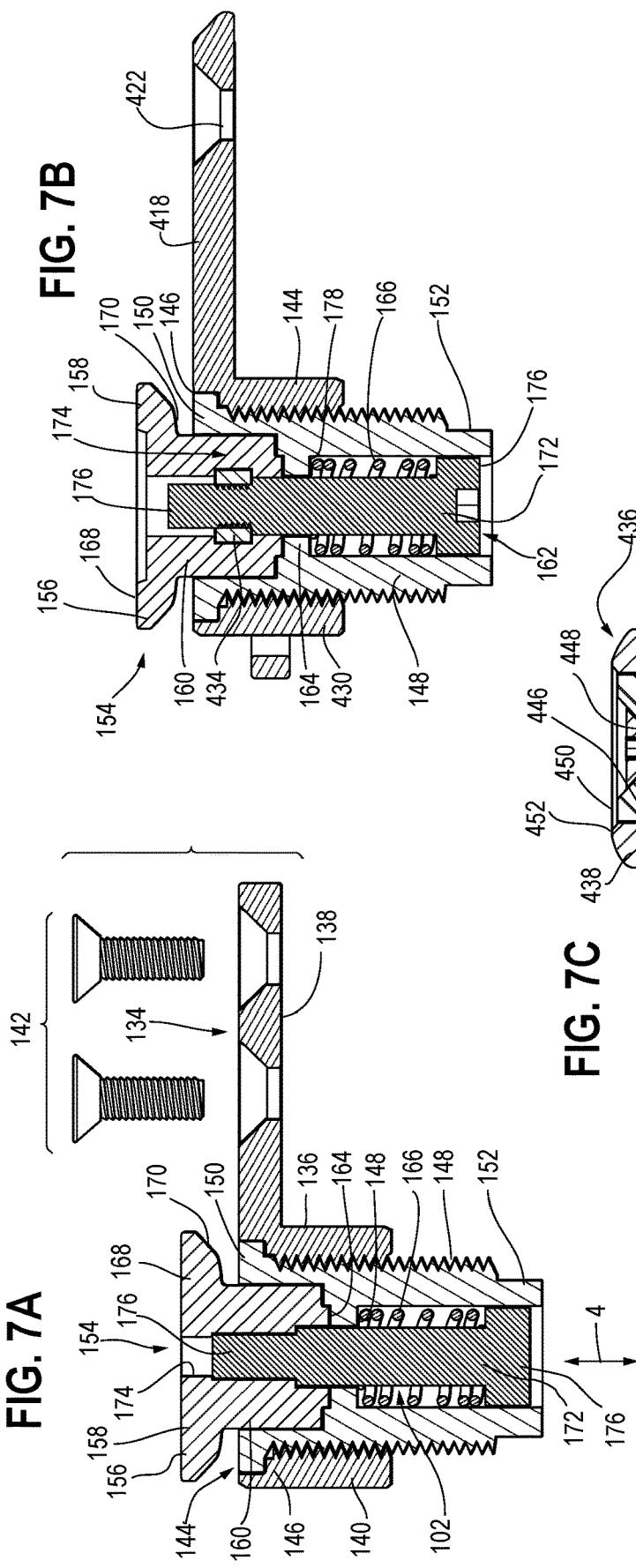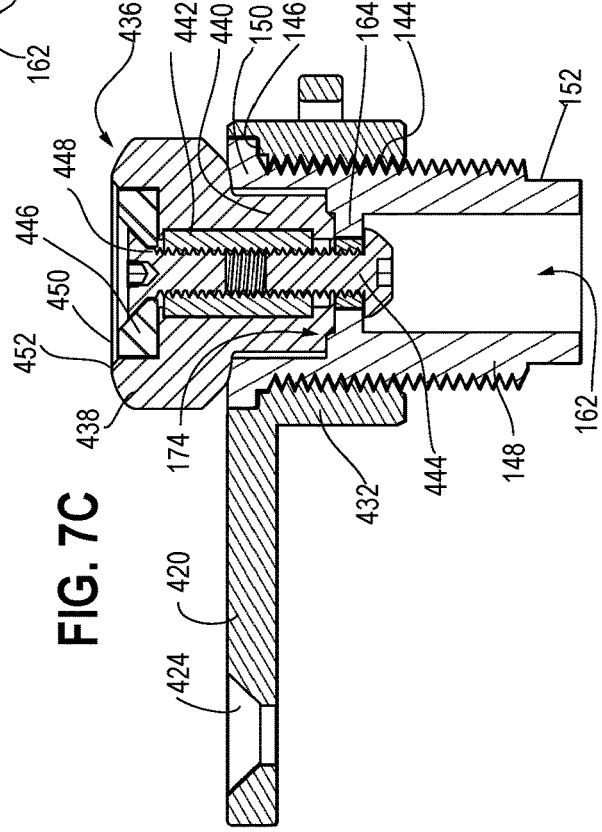

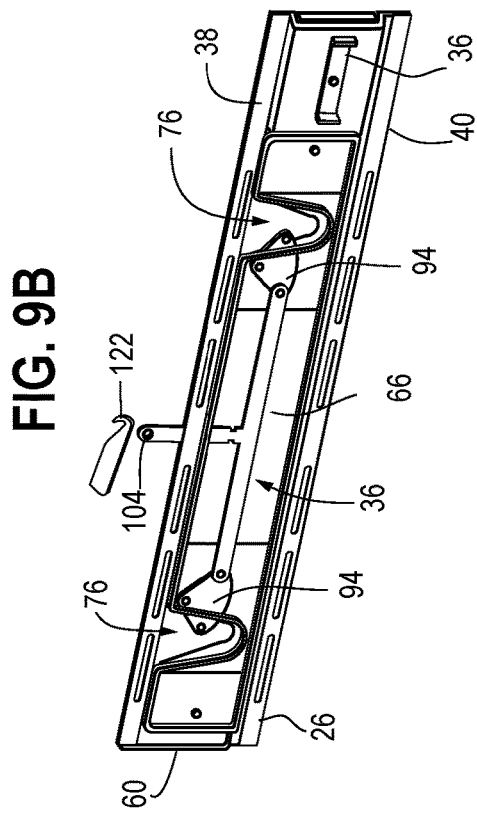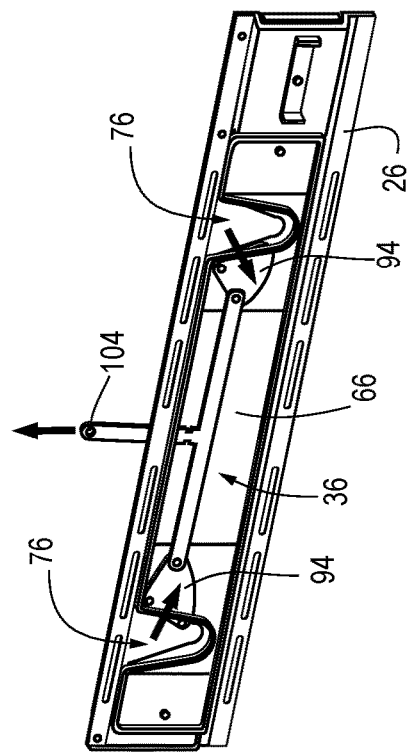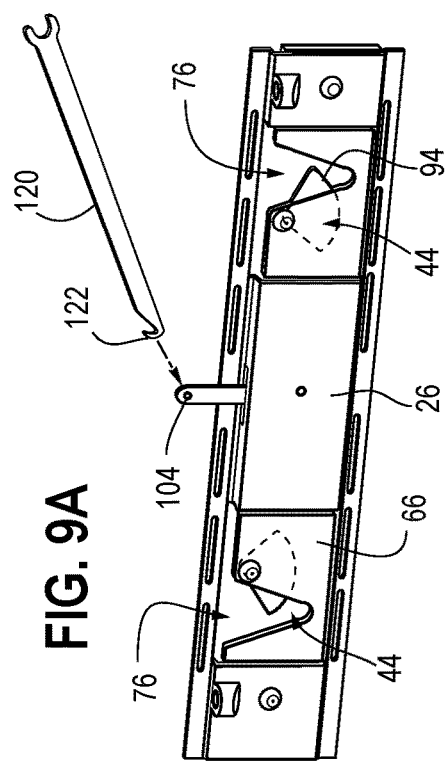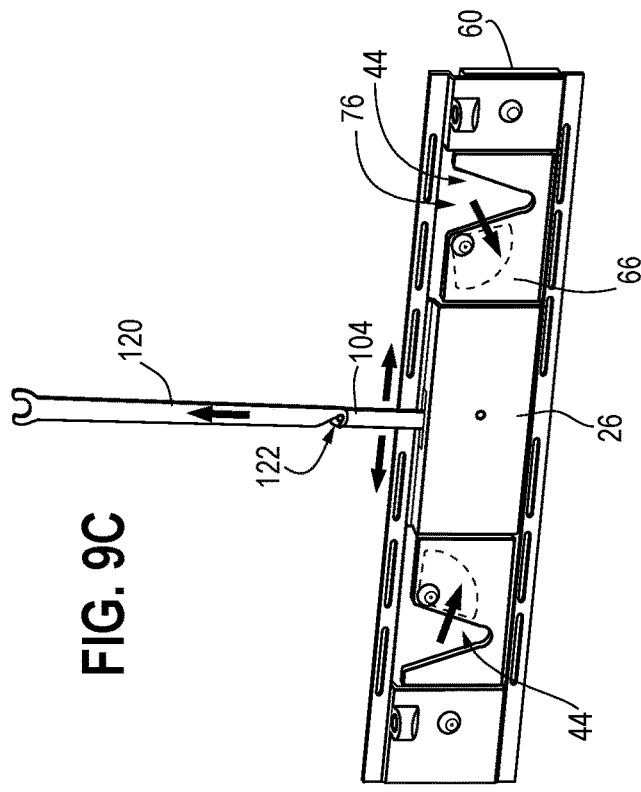

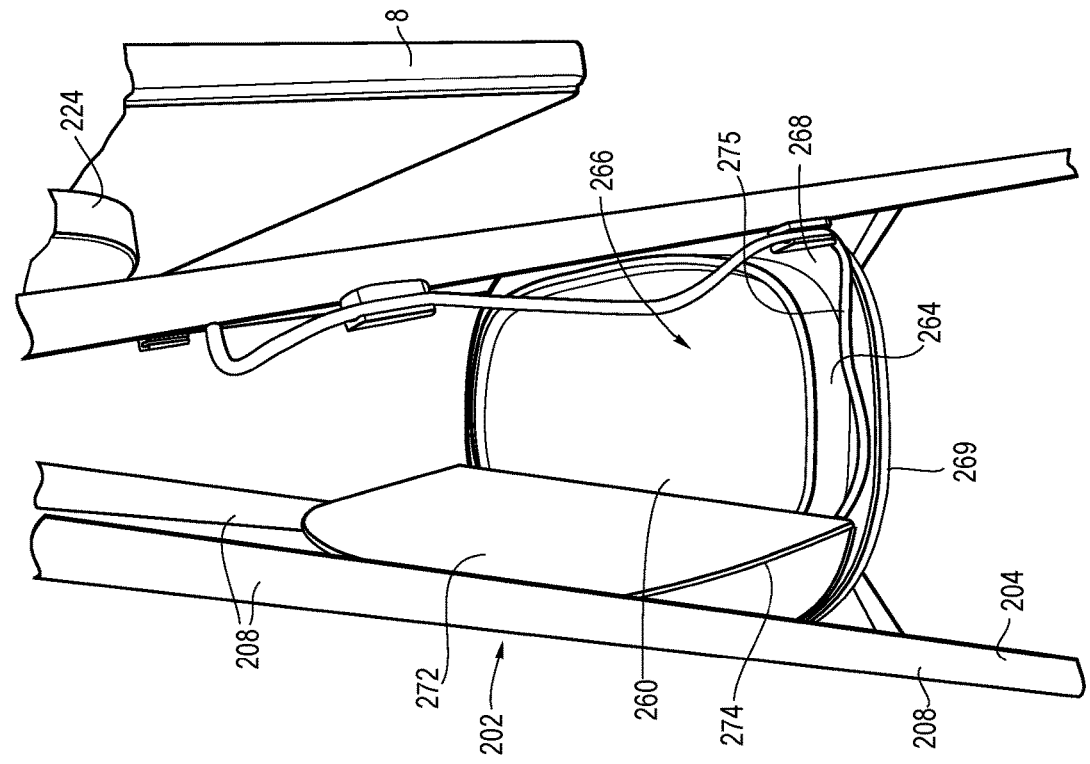
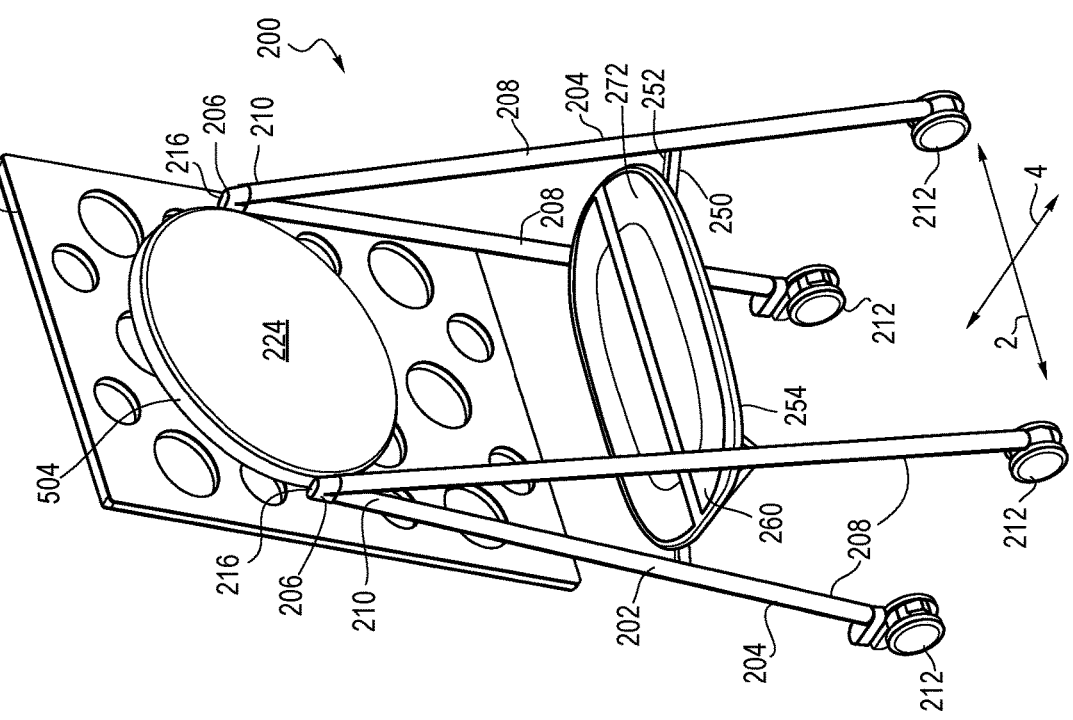

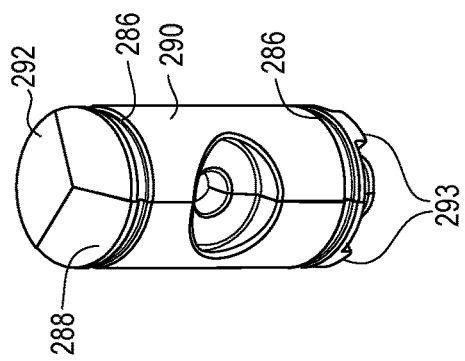
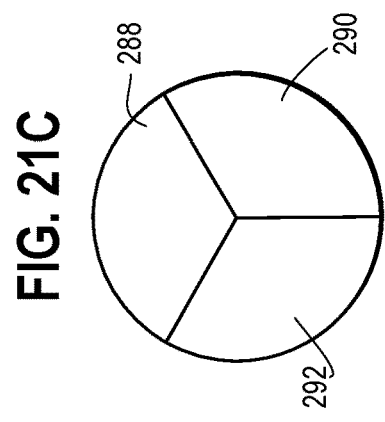
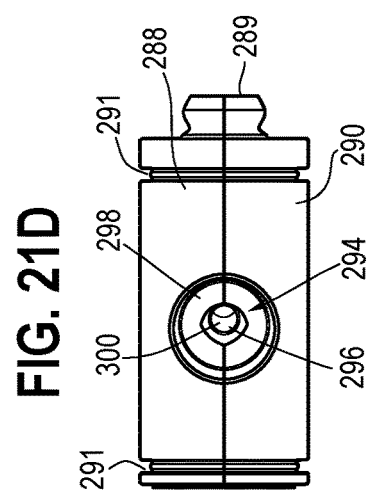
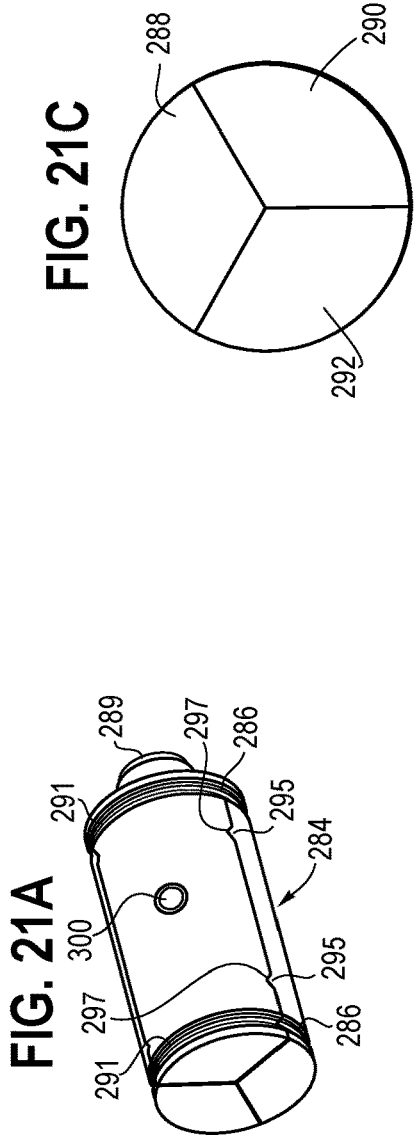
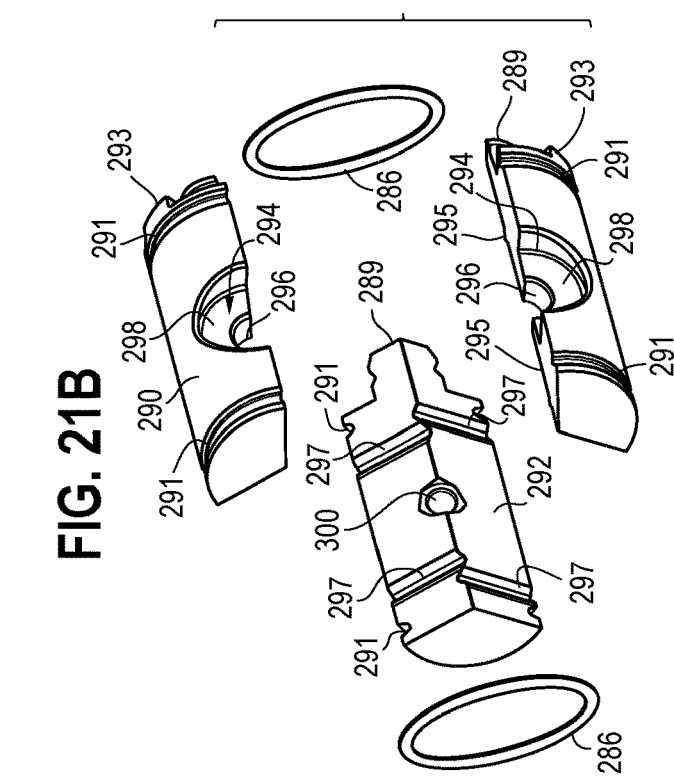

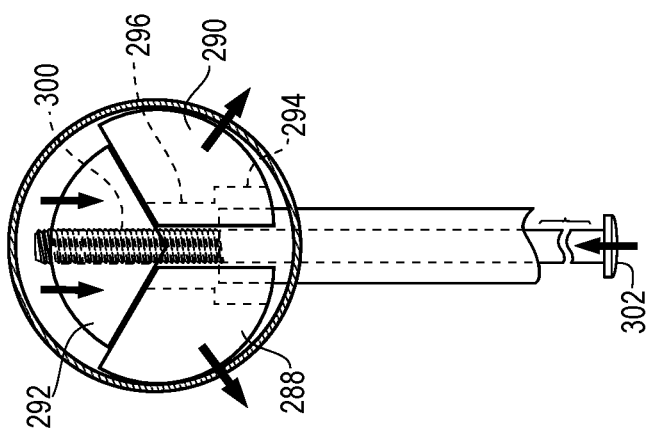
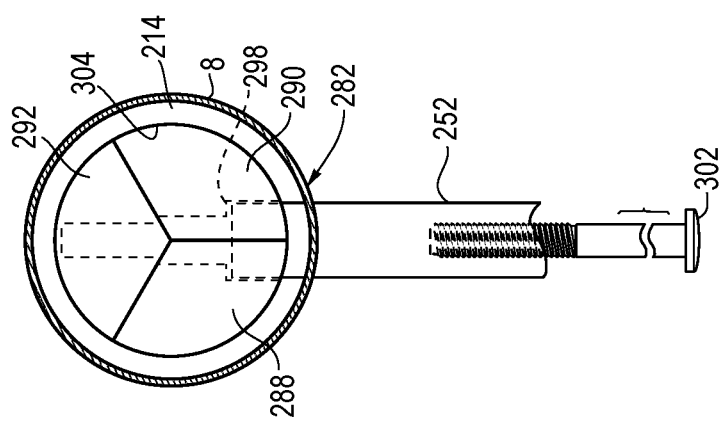

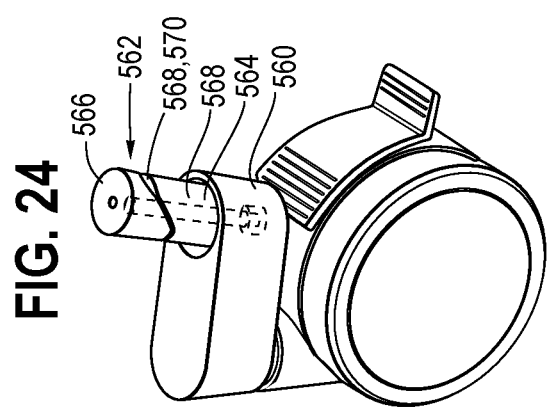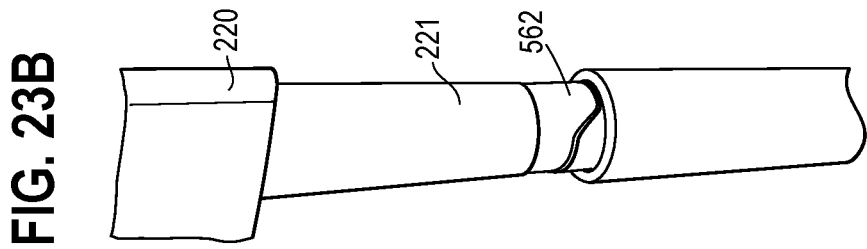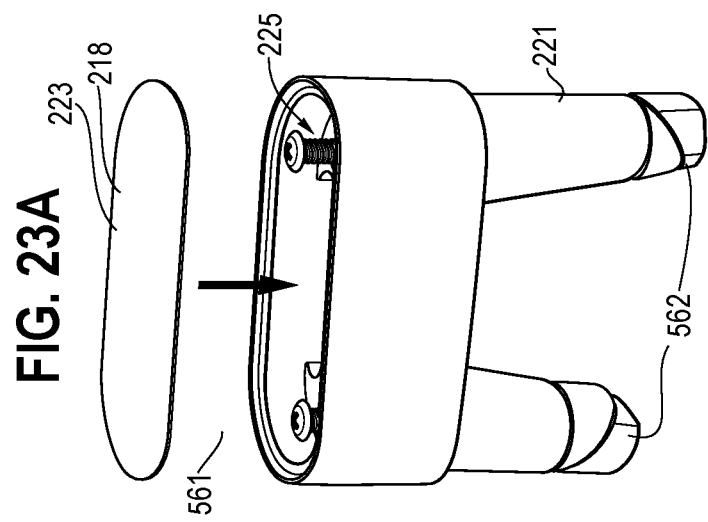

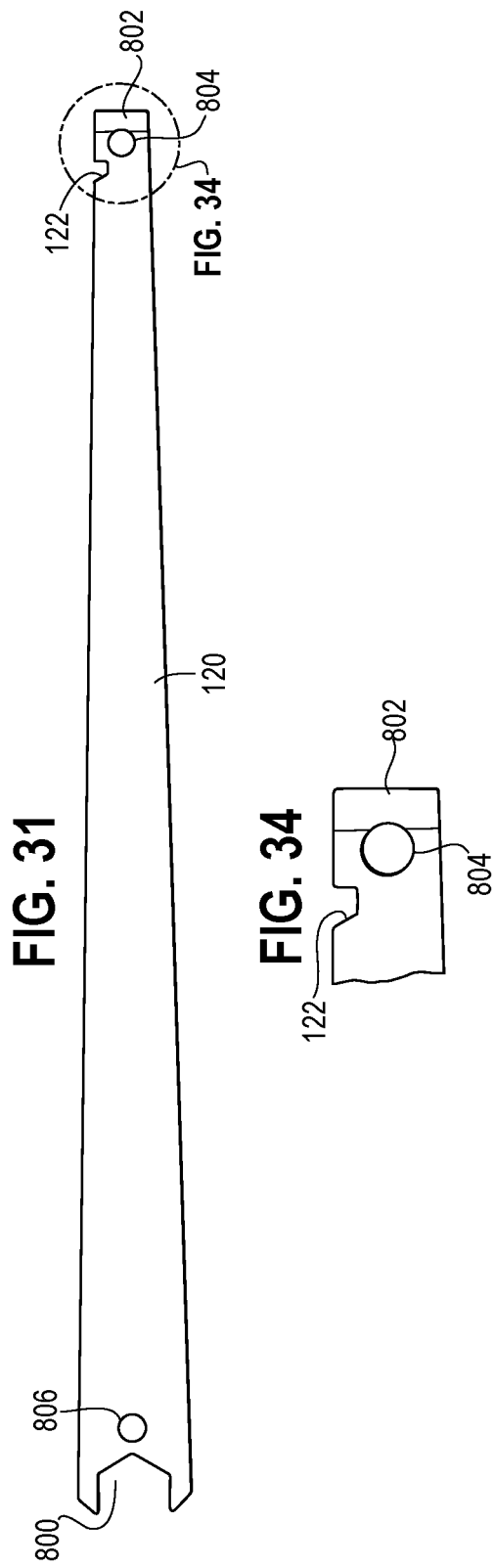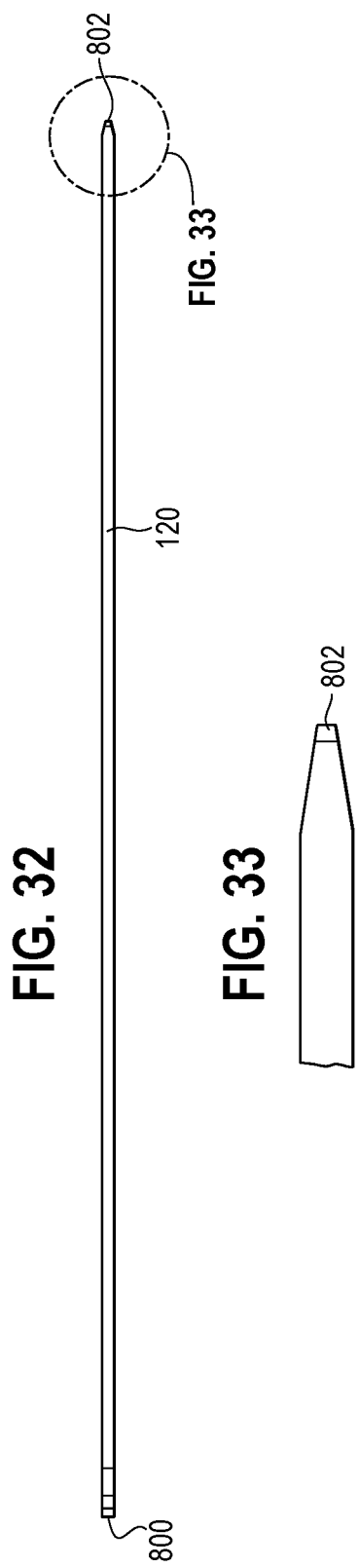

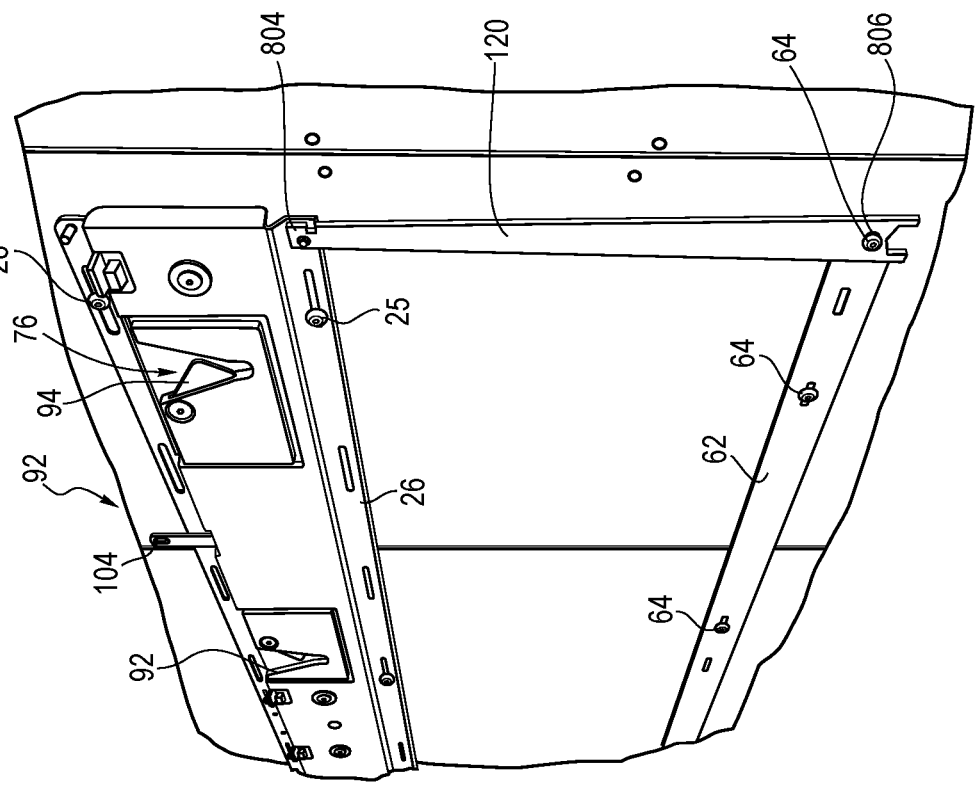

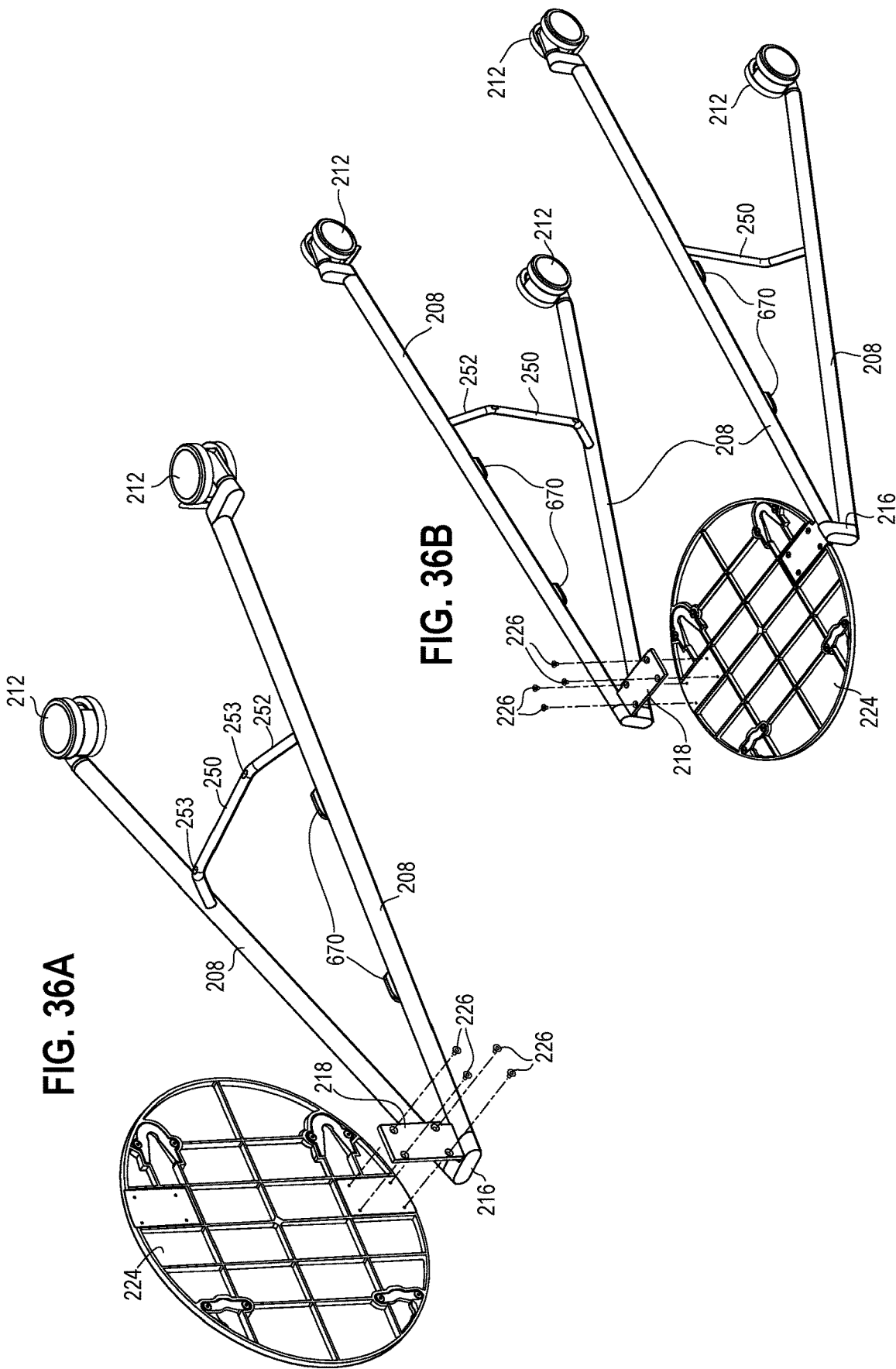

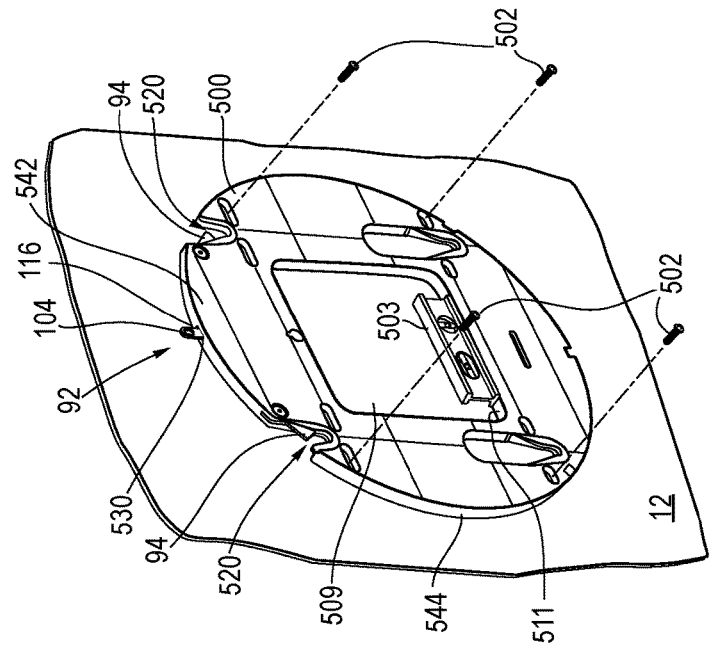
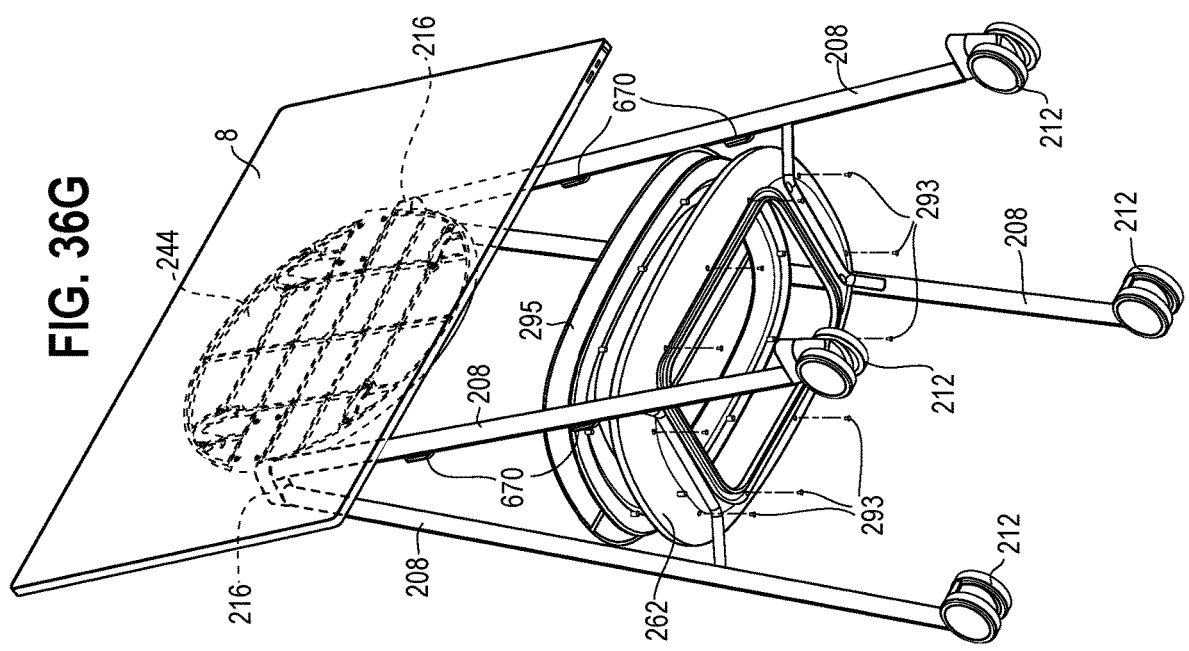

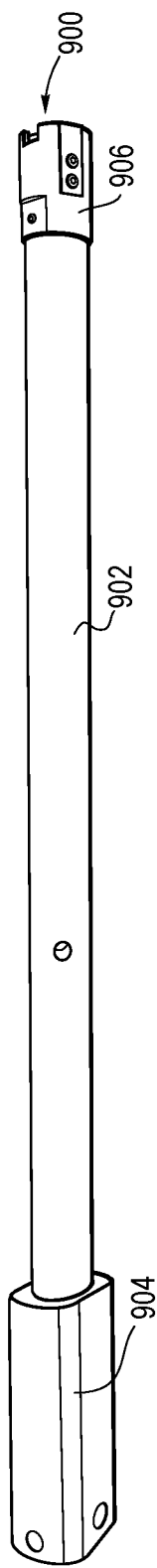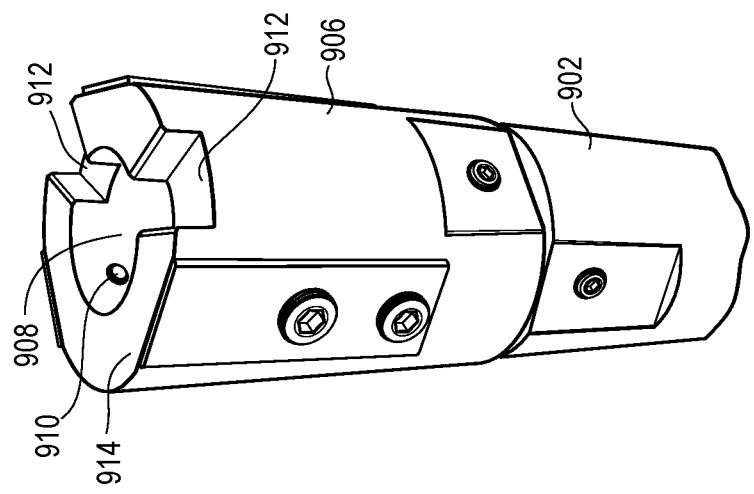

DISPLAY SUPPORT SYSTEM AND METHOD FOR THE USE THEREOF

This application is a continuation of U.S. application Ser. No. 16/749,650, filed Jan. 22, 2020, which claims the benefit of U.S. Provisional Application No. 62/796,441, filed Jan. 24, 2019, both entitled "Display Support System and Method For The Use Thereof," and the entire disclosure of which are hereby incorporated herein by reference.

FIELD OF THE INVENTION

The present disclosure relates generally to a display support system and components, and methods for the use, assembly and reconfiguration thereof.

BACKGROUND

While technology advances have allowed for larger electronic visual displays to become more commonplace, technology and manufacturing limitations, together with fabrication expense, may limit the size and shape of certain desired display configurations. To accommodate those desired configurations, including a large overall display area, smaller displays may be arranged in an array, or tile system. Because a visual image is commonly shown across the overall display configuration, with each individual display showing a portion of the image, it is desirable for the display surfaces to be aligned and flush. Such alignment may be difficult when a support surface, such as architectural wall, is out of plane or uneven. In addition, one or more of the display screens within the array may function as an input device via a touch screen. In such a configuration, the displays are subjected to various forces exerted by the user that may tend to dislodge the displays and/or push them out of alignment.

In other environments, it may be desirable to make an electronic visual display portable, such that it may be easily moved to a desired viewing location. Often, carts that may accommodate such visual displays are boxy and cumbersome, and are not configured to easily accommodate various cords and accessories associated with the display.

SUMMARY

The present invention is defined by the following claims, and nothing in this section should be considered to be a limitation on those claims.

In one aspect, one embodiment of a display support system includes a support rail extending in a first direction and at least one support bar carried by the support rail. The at least one support bar has at least one receptacle opening upwardly in a second direction orthogonal to the first direction. The at least one support bar is moveable relative to the support rail in at least the first and second directions. A mounting member includes an insert portion, configured in one embodiment as a neck and head, received in the receptacle and engaging the support bar, with the mounting member being adapted to be coupled to a display.

In one embodiment, the display support system includes a support rail having a top, a bottom and a side wall defining a cavity. A plurality of support bars are disposed in the cavity and spaced apart along the first direction. Each of the support bars includes a pair of receptacles spaced apart in the first direction and opening upwardly along the second direction orthogonal to the first direction. A plurality of pairs of mounting members engage the support bars, with each of the pairs of mounting members being adapted to be coupled to a separate display.

In another aspect, one embodiment of a method of mounting an array of displays on a wall includes mounting a support rail to the wall, wherein the support rail extends in a first direction. The support rail has a top, a bottom and a side wall defining a cavity, wherein the side wall is spaced apart from the wall. The method includes disposing a plurality of support bars in the cavity, wherein the support bars are spaced apart along the first direction, with each of the support bars having a pair of receptacles spaced apart in the first direction and opening upwardly in a second direction orthogonal to the first direction, coupling pairs of mounting members to each of a plurality of displays, wherein each of the mounting members has an insert portion, inserting the insert portions of the pairs of mounting members in the pairs of receptacles of a corresponding one of the support bars, and engaging the support bars with the insert portions of each pair of mounting members.

In another aspect, one embodiment of a support cart for a display includes a frame having a pair of spaced apart side supports each defining an apex. A plate is disposed between the side supports and is connected to the apices of the side supports. The plate includes a plurality of mounting locations configured to support a display. A tray is positioned below the plate and extends between and is connected to the side supports.

In one aspect, one embodiment of the frame incudes a first tube having an annular side wall and a first opening formed in the side wall. A second tube extends transverse to the first tube and has an end portion disposed through the first opening. A cylindrical wedge having first, second and third sectors is disposed in the first tube. A second opening is defined in the first and second sectors, and a third opening is defined in the third sector, wherein the first, second and third openings are coaxial. The end portion of the second tube is disposed in the second opening. A fastener extends through a portion of the second tube and the second opening in the first and second sectors and is threadably engaged with the third sector at the third opening.

The various embodiments of the display support system, and methods for the configuration and use thereof, provide significant advantages over other display support systems, and components used therein. For example and without limitation, the display support system allows for an array of displays to be quickly and easily aligned in each of the X, Y and Z directions. The displays may also be quickly mounted on a corresponding support bar and thereafter locked in position, or released therefrom with a quick release feature. The support system provides for a robust mounting arrangement that maintains the alignment of the displays even when subjected to various external forces, including forces applied by users interacting with a touch screen. The support system also provides for movement of the display away from the wall, for example to access the back of the display, while also managing the various cables and cords associated with the displays.

The support cart, and frame components thereof, also provides various advantages, including a robust structure that allows for a user interface, while providing an aesthetic storage for various cables, cords and the like. The frame structure, with its tube-to-tube interface and wedge connectors, provides for a seamless exterior appearance without the need for welding, which thereby allows for the cart to be easily disassembled into a knock-down configuration.

The foregoing paragraphs have been provided by way of general introduction, and are not intended to limit the scope of the following claims. The various preferred embodiments, together with further advantages, will be best understood by reference to the following detailed description taken in conjunction with the accompanying drawings.

BRIEF DESCRIPTION OF THE DRAWINGS

FIGS. 3A and B are rear views of a mounting plate with different mounting member embodiments coupled to the backside of a display.

FIGS. 7A-C are cross-sectional views of alternative mounting members shown in FIGS. 6A and B when assembled.

FIGS. 9A and 9B are front and rear views of a portion of the display support system in a locked configuration.

FIGS. 9C and 9D are front and rear views of a portion of the display support system in an unlocked configuration.

FIG. 14 is a rear perspective view of a support cart with a display secured thereto.

FIG. 15 is an enlarged, partial view of a tray carried by the support cart.

FIGS. 21A-E are various views of a cylindrical wedge member in an assembled in exploded configuration.

FIGS. 22A and B are cross-sectional views of the tube-to-tube connection with a wedge member.

FIGS. 23A and B are views of a bracket and wedge assembly.

FIG. 24 is a perspective view of one embodiment of a caster.

FIG. 31 is a front view of a multi-function tool.

FIG. 32 is a side view of the tool shown in FIG. 31.

FIG. 33 is an enlarged end view of the tool taken along line 33 of FIG. 32.

FIG. 34 is an enlarged end view of the tool taken along line 34 of FIG. 31.

FIGS. 36A-G are views showing the sequential assembly of the support cart.

FIGS. 37A-C are views showing a single wall mount assembly.

FIGS. 38A and B show a tool for installing a cylindrical wedge member in support leg tube.

DETAILED DESCRIPTION OF THE PRESENTLY PREFERRED EMBODIMENTS

It should be understood that the term "plurality," as used herein, means two or more. The terms "longitudinal" as used herein means of or relating to length or the lengthwise direction 2, for example between the opposite ends of a support rail 26. The terms "lateral" and "transverse" as used herein, means situated on, directed toward or running from side to side, and refers to a lateral direction 4 transverse to the longitudinal direction. In one embodiment, the longitudinal and lateral directions correspond to the X and Z directions, both lying within a horizontal plane, with a vertical direction 6 running in the Y direction. The term "coupled" means connected to or engaged with whether directly or indirectly, for example with an intervening member, and does not require the engagement to be fixed or permanent, although it may be fixed or permanent (or integral), and includes both mechanical and electrical connection. The terms "first," "second," and so on, as used herein are not meant to be assigned to a particular component of feature so designated, but rather are simply referring to such components or features in the numerical order as addressed, meaning that a component or feature designated as "first" may later be a "second" such component or feature, depending on the order in which it is referred. For example, a "first" opening may be later referred to as a "second" opening depending on the order in which they are referred. It should also be understood that designation of "first" and "second" does not necessarily mean that the two components, features or values so designated are different, meaning for example a first opening may be the same as a second opening, with each simply being applicable to separate but identical features.

Wall System

Displays

Figure 1:
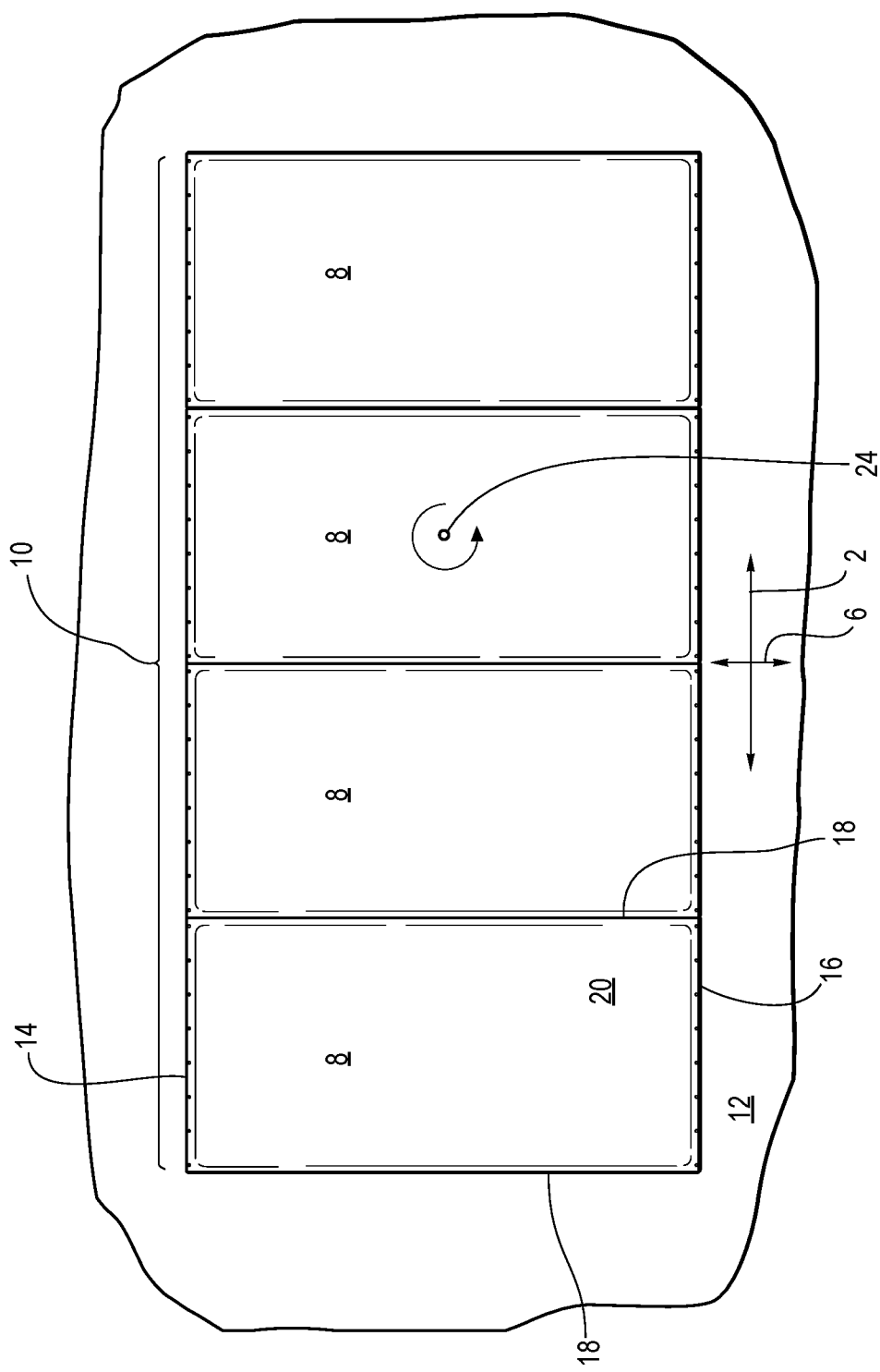
FIG. 1 is a front view of an array of electronic visual display.
Figure 2:
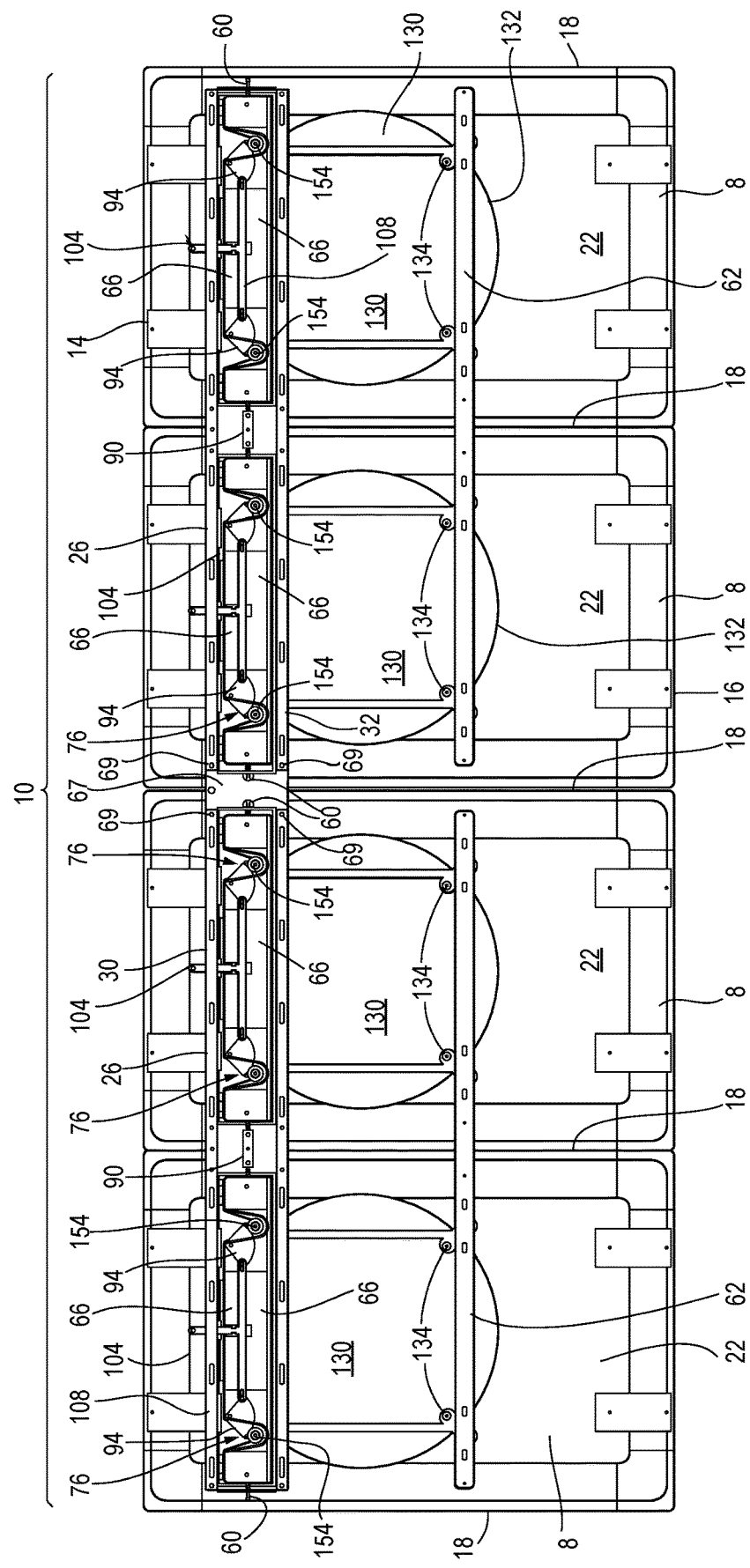
FIG. 2 is a rear view of one embodiment of a display support system secured to an array of displays.
Figure 4B:
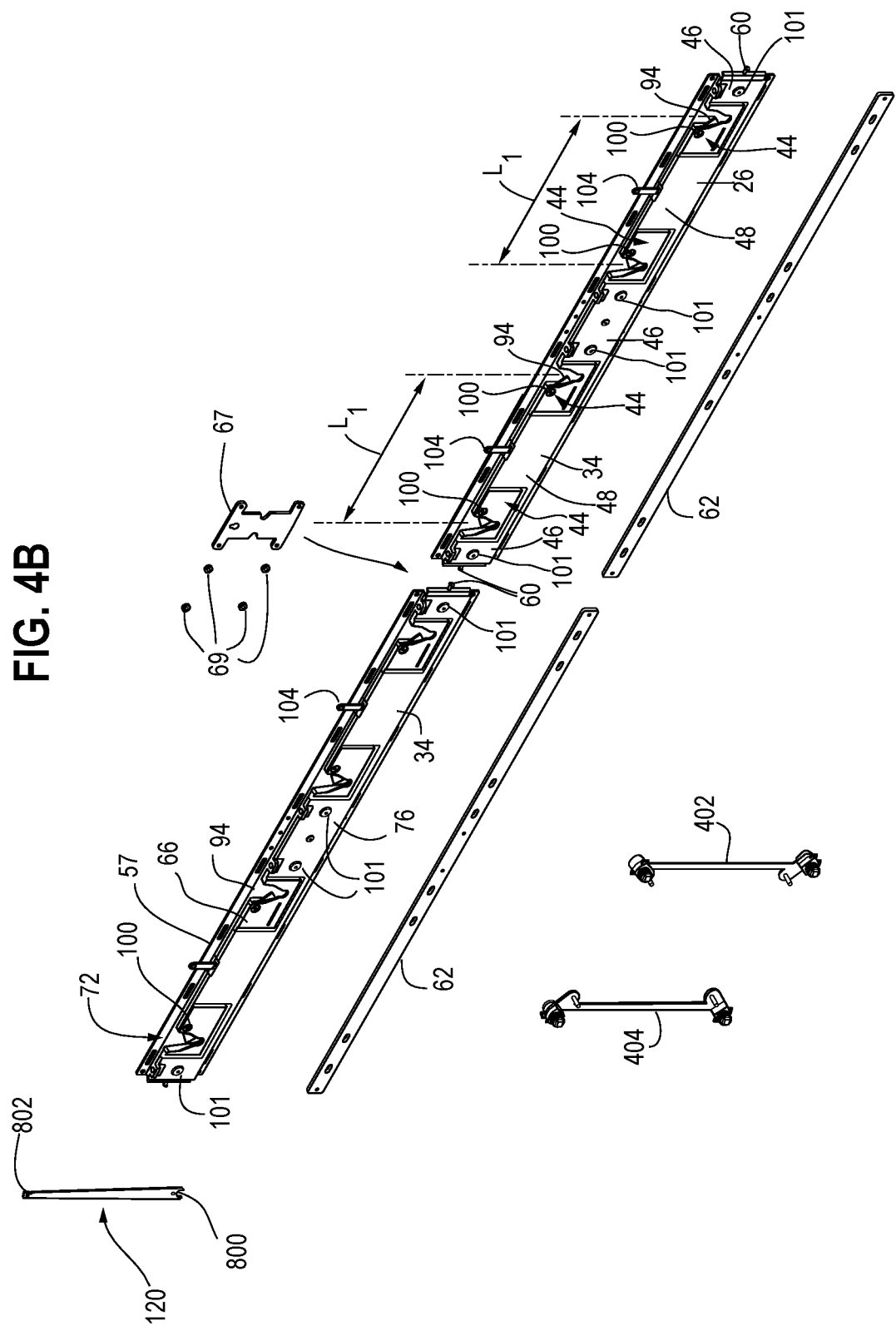
FIGS. 4A and B are exploded views of alternative embodiments of a display support system.

Referring to FIGS. 1 and 2, a plurality of electronic visual displays 8 are arranged in an array, shown as a linear horizontal array 10 of four (4) displays mounted to a wall 12, which may be any type of support wall, including for example an architectural wall integrated into a building structure, or a more temporary and reconfigurable wall, including for example and without limitation an office wall panel system. In one embodiment, each of the displays 8 has a rectangular shape, with a top 14, a bottom 16, opposite sides 18, a front surface 20 and a rear surface 22. The front surface 20 may be configured as a user interface, including a touch sensitive screen. In other embodiments, the displays may be configured in different shapes and sizes. In the embodiment, shown, the displays are arranged with a longer dimension extending in the vertical direction 6, with adjacent sides 18 of the displays being abutted. In other embodiments, the longer dimension may be arranged in the horizontal, longitudinal direction 2. In one embodiment, the displays 8 are rotatably supported about a horizontal axis 24 extending in the Z-direction, or lateral direction 4, such that the orientation of the displays may be changed from a horizontal to a vertical orientation. In yet another embodiment, shown in FIGS. 37 A and B, a single display is mounted to a wall.

Support Rails

Referring to FIGS. 2-5, 9A-D, 12 and 35 A and B, one or more support rails 26, 62 are secured to the wall 12 with a plurality of fasteners 28, 64. Each of the support rails 26, 62 is elongated in the longitudinal direction 2 and is positioned horizontally in one embodiment. It should be understood that the support rails may be positioned in non-horizontal orientations. Each support rail 26 has a top 30, a bottom 32 and a front side wall 34, which form a cavity 36 in combination. Vertical flanges 38, 40 extend upwardly and downwardly from the top and bottom, with the flanges including openings 42, e.g., elongated, shaped to receive the fasteners 28 that secure the support rail to the wall. When the support rail 26 is fastened to the wall, the wall 12 closes off a far side of the cavity 36 spaced laterally from the front side wall 34 in the lateral direction 4.

Each of the top and side walls 30, 34 has one or more pairs of enlarged openings 44, or windows, formed therein. The pairs of windows are spaced apart a distance L1 as shown in FIGS. 4A and B. In one embodiment, the windows have a rectangular shape and extend from the bottom 32 of the support rail to the upper vertical flange 38. The windows separate alternating coupling portions 46 and release portions 48 of the front side wall and top. Each coupling portion includes one or more enlarged openings 54 formed in the front side wall, with the openings being enlarged, e.g., elongated, in the horizontal and vertical directions, which allows for movement of a support bar 66 relative to the support rail 26 in the X and Y directions as explained in more detail below.

Figure 5:
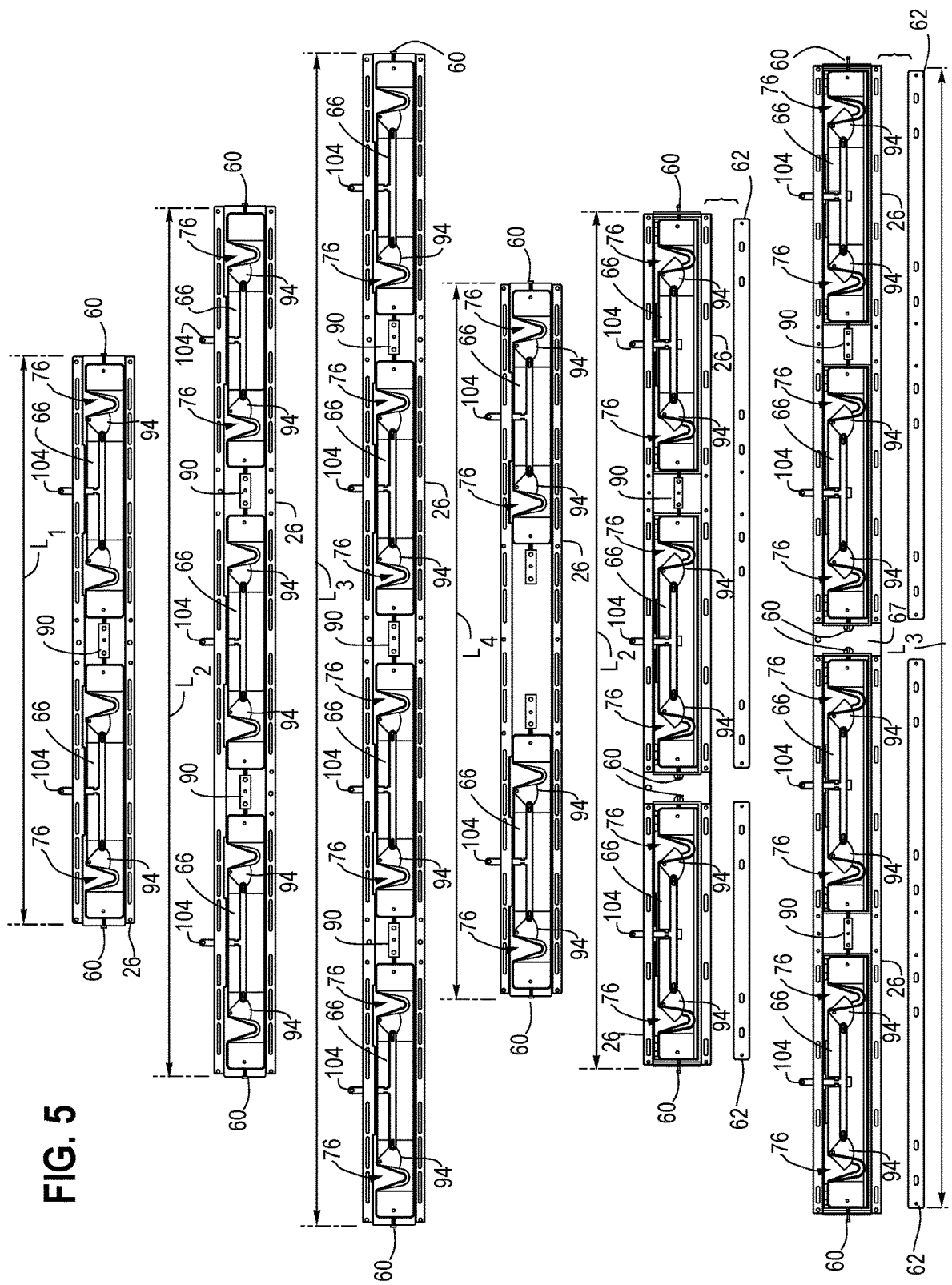
FIG. 5 are rear views of different embodiments of display support systems.

Referring to FIG. 5, various embodiments of the support rails 26 may have different lengths to accommodate different display arrays. For example, first, second and third support rails are configured with first, second and third lengths (11, 12,13), with two, three and four pairs of openings and support bars 66 formed in each support rail respectively and supporting two, three or four displays. In the embodiment having a length 14, the displays 8 are configured in a horizontal orientation, whereas in the embodiments having a length 11, 12 and 13, the displays have a vertical orientation. A fourth rail has a fourth length (14) greater than the first length and less than the second length, but is configured with two pairs of openings to support two displays. As shown in FIGS. 2 and 5, a pair of support rails 26 may be spaced apart along the longitudinal direction, each configured to support a one or more (e.g., a pair) of displays, and with a ganging connector plate 67 coupled between adjacent sides of the support rails, being secured for example with a plurality of fasteners 69, shown as four.

Figure 12:
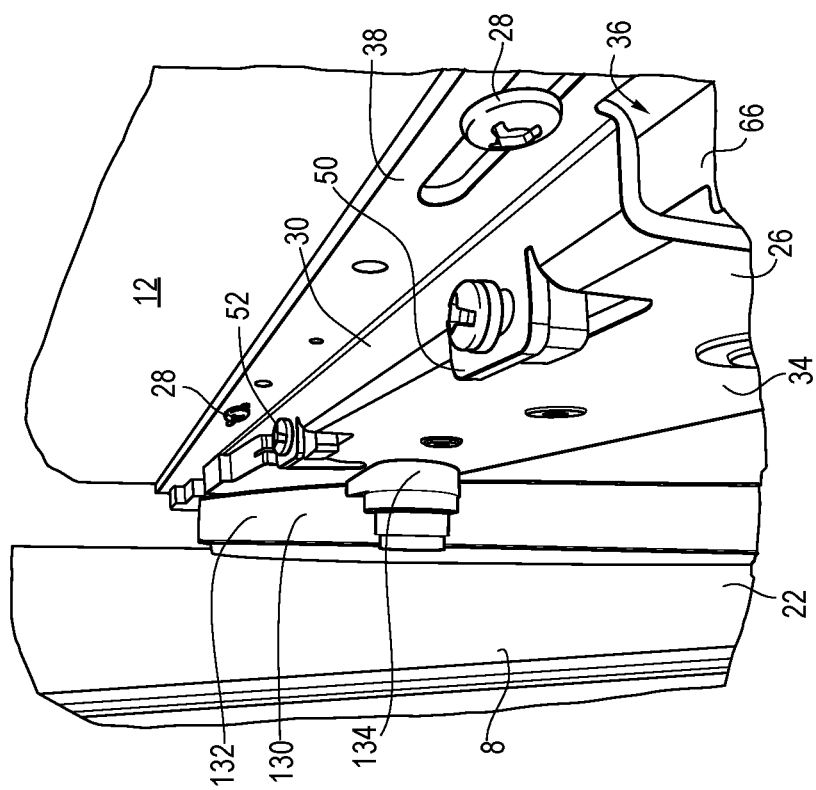
FIG. 12 is an enlarged partial perspective view of a display support system secured to a wall.
Figure 35B:
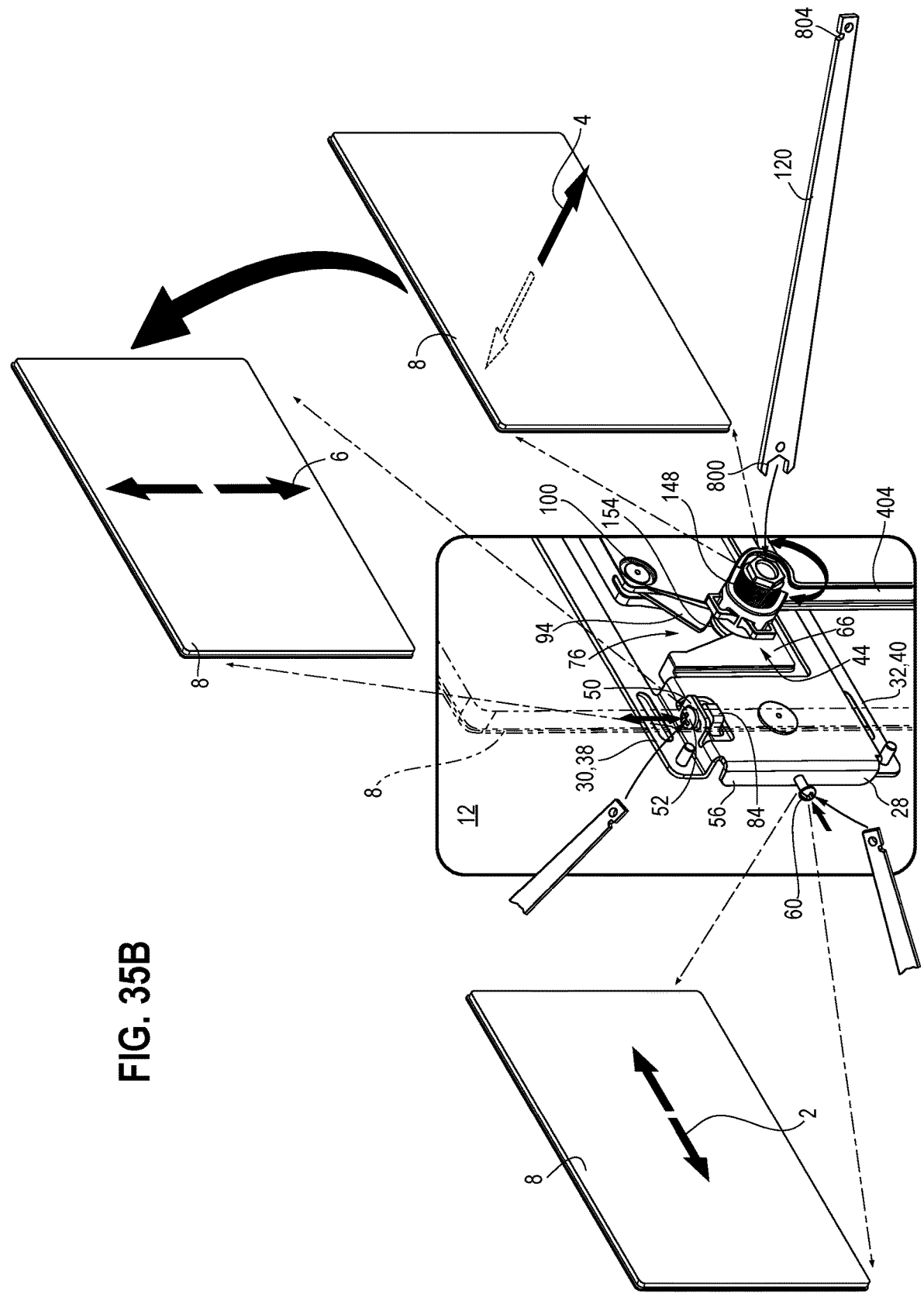
FIGS. 35A and B are partial perspective view of a wall installation using the tool shown in FIG. 31.
Figure 36D:
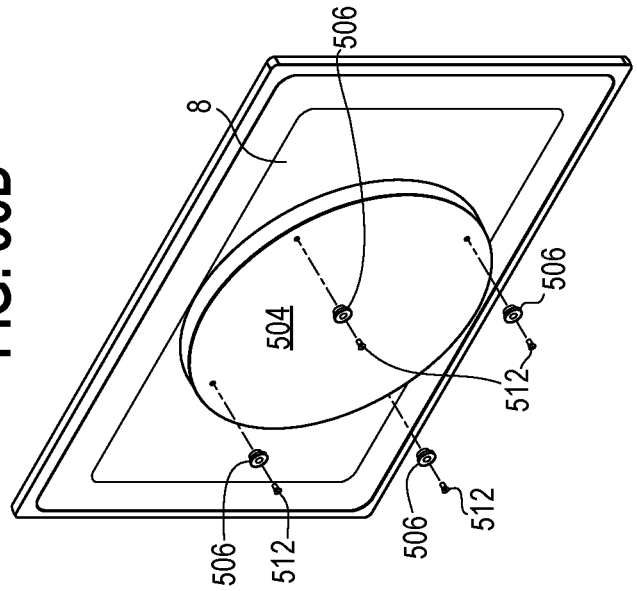
Figure 36C:
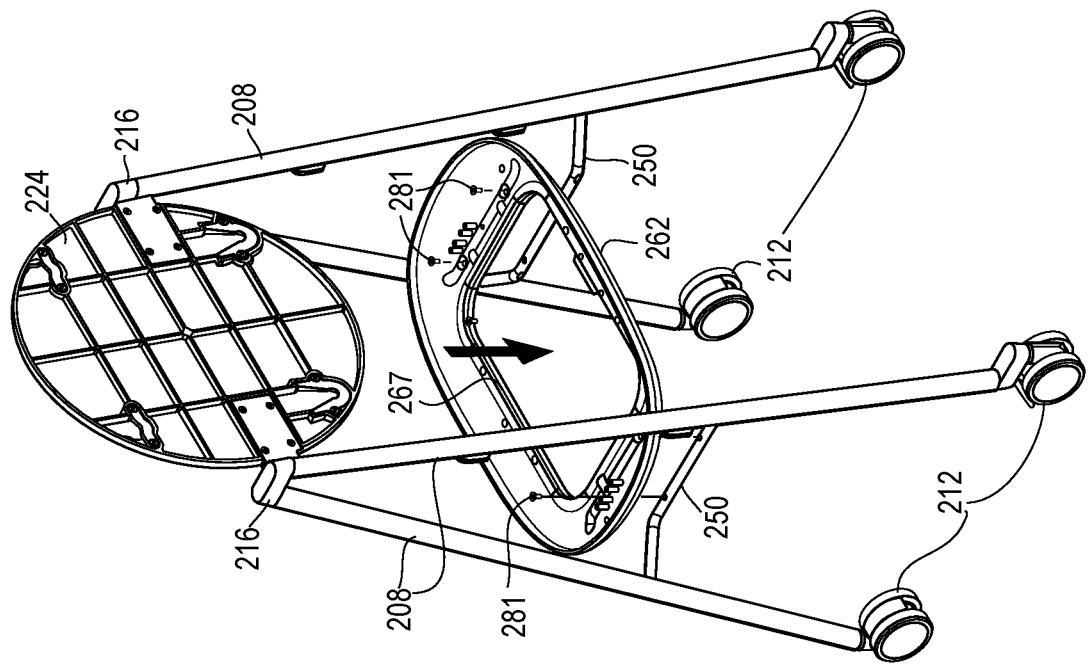
Figure 36F:
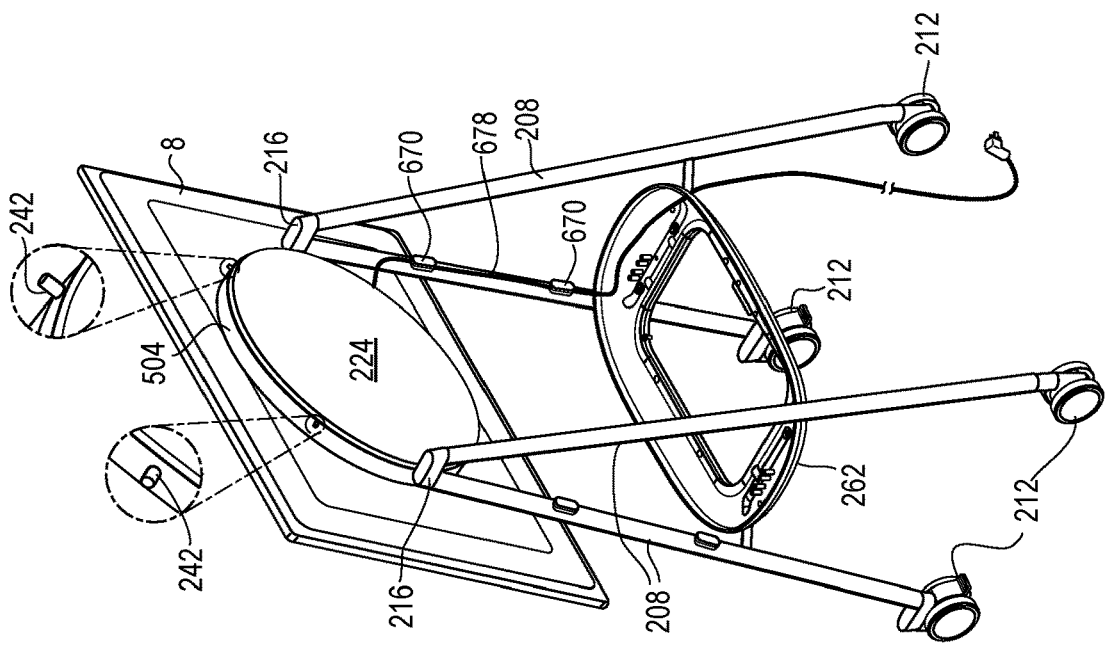
Figure 36E:
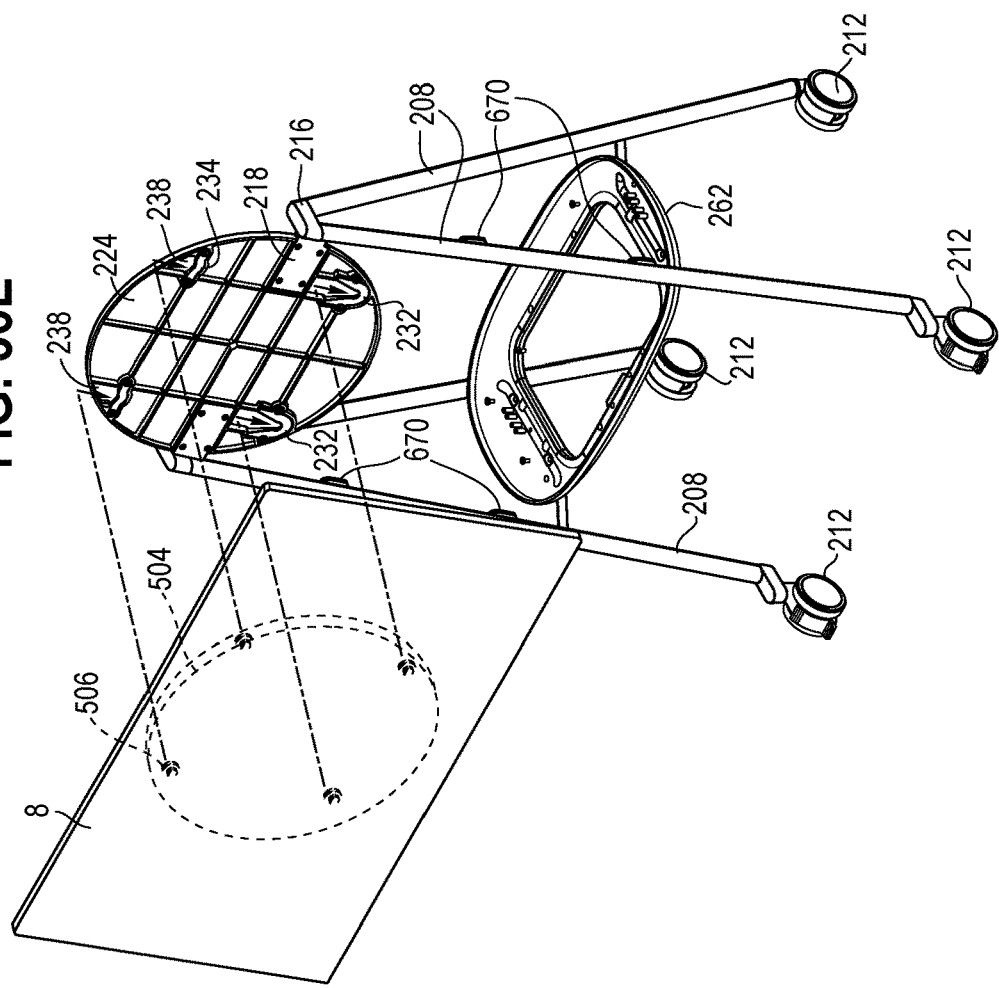

As shown in FIGS. 4A, 12 and 35B, the top 30 of the coupling portion 46 of the rail includes a plurality of platforms 50, formed in one embodiment as flanges that extend outwardly from the front side wall in the lateral direction, having an opening. Alternatively, the openings may simply be arranged in the top. The openings receive an adjustment member 52, configured in one embodiment as a screw or other threaded fastener. The top of the release portion 48 of the rail includes an opening 57 centered over the release portion.

The support rail also includes end walls 56 positioned at opposite ends of the support rail and closing the ends of the cavity 36. Each end wall includes an opening 58, which may be threaded in one embodiment to threadably receive an adjustment member 60, configured in one embodiment as a screw or other threaded fastener.

Referring to FIGS. 2, 4B, 5, 13 and 35A, one or more second support rails 62 are spaced apart from the first support rail 26 in the Y direction 6, which is the vertical direction in one embodiment, and runs parallel to the first support rail. In one embodiment, the second support rail is disposed below the first support rail, although it should be understood that it may be disposed above the support rail in a spaced apart relationship therewith. The second support rail 62 is an elongated bar or plate, which is secured to the wall 12 with a plurality of fasteners 64. The second support rail is made of a material, or includes portions thereof, that are ferromagnetic, or capable of being magnetically attracted and securely held by a magnet. Alternatively, the second support rail may include a magnetic material, or portions thereof may be magnetic.

The support rails 26, 62 may be made of any rigid material, including for example and without limitation a metal, such as steel or aluminum, or a plastic, composite or other suitable material.

Support Bars

Referring to FIGS. 4A and B, 5, 8 and 35B, at least one support bar 66, and in embodiments where more than one display is being mounted to a support rail, a plurality of support bars are carried by the support rail 26. Each support bar is elongated in the first direction 2. Each support bar has a top 68, a bottom 70, a front side wall 72 and opposite end walls 74. A pair of upwardly facing receptacles 76 are spaced apart a distance L1 and formed in the front side wall 72, such that the receptacles are exposed in the windows 44 of the support rail, with the opening in the top of the rail aligned with and forming a mouth for the receptacle. In one embodiment, the receptacles are configured as notches. The support bar includes a rim portion 78 formed around the periphery of the notch to provide increased rigidity and strength, with a side surface of the rim portion, or support bar, providing a bearing surface. A bottom 80 of the notch is circular, defined by a radius R. It should be understood that the term "notch" refers to any opening, depression, groove, slot, recess, divot, etc. having opposite sides, regardless of the depth or slope thereof.

A pair of horizontal pivot axes 82 are positioned outboard of the receptacles adjacent the top of the support bar. The top of the support bar also includes a pair of bosses 84, or flanges, extending laterally outwardly through the side wall of the rail and dimensioned to underlie and be aligned with the flanges/platforms 50 of the support rail. The bosses each include an opening 86, preferably threaded, that receives the adjustment member 52. The front side wall has a plurality of openings 88 in each end thereof that are aligned with the openings in the coupling portion of the support rail. The front side walls 34, 72 are secured one to the other with fasteners 101, e.g., a large head rivet, but with the enlarged openings 54 allowing for vertical and horizontal adjustment, or float, in the Y and X directions of the support bar relative to the support rail. The support bar has openings 126 formed in the end walls 74 that are engaged by adjustment members 126.

If more than one support bar is located within the cavity 36 of the support rail, a connector 90 may be secured between the ends walls of adjacent support bars.

Lock/Quick Release Mechanism

Referring to FIGS. 2, 4A and B, 5, 8, 9A-D, 35A and B and 37A and C, a lock mechanism 92 includes a pair of lock members 94, shown as sector shaped cam members with a convex edge 96. An apex 98 of each lock member is pivotally connected to the support bar at the pivot axes 82 with a pivot member, e.g. pin 100. An inboard corner 102 of each sector is pivotally connected to a T-shaped release member 104 having a longitudinally and horizontally extending cross member 108 and an upright, vertical member 106. The ends of the cross member 106 have an elongated slot 110 extending in the longitudinal direction 2, with a pin 112 extending through the sector and sliding within the slot 110. The upright member 108 extends upwardly through an opening 114 in the top of the support bar and the opening 57 in the top of the release portion 46 of the support rail. A pair of notches 116 are formed in each side of the vertical, upright member 106 adjacent the junction with the cross member 108, with the notches 116 acting as catches as they engage edges of the top 68 of the support bar adjacent the opening 114, with the edges 124 also acting as catches. In operation, the vertical, upright member 106 may be engaged, for example with a hook portion 122 of a tool 120 inserted through an opening 118 formed in the top of the vertical member, and moved upwardly through the openings. As the release member 104 moves upwardly in the Y direction 6, the ends of the cross member 108 move upwardly and pivot the cam members 94 about the pivot axes 82 such that the convex edge 96 is not disposed across the notch 76 and it remains open. The release member 104 may be maintained in an engaged position, with the lock members 94 in the unlocked position, by engaging one of the catches 116 on the upright member with one of the catches 124 in the top of the support bar. The release member 104 may be moved to a disengaged position, where the upright member 106 is centered in the opening 114 and allowed to move downwardly therethrough to a disengaged position, with the lock members 94 pivoting to a locked position and with the convex edge 96 disposed across and closing the notch 76.

The position of the support bars 66 may be adjusted relative to the support rail 26 by rotating the adjustment members 60, 52 to threadably engage the support bar 66 at openings 86, 126 and thereby move the support bar in the X and Y directions 2, 6 respectively.

Display Mounting Assembly

Referring to FIGS. 2, 3A and B, 6A-D, 7A-C, 10D, 12 and 13, a display support 128 is secured to the rear surface of a display, for example with various fasteners. In one embodiment, the display support includes a plate 130 configured as a circular disk having an outer circumferential edge 132. A plurality of (shown as four) mounting members 134 include a base 136 having a mounting flange 138 and a hub 140. The mounting flange is secured to the rear of the display support 128 with fasteners 142, with the hub 140 overlying the surface of the circumferential edge 132. The four mounting members are arranged equidistant around the circumferential edge, or at 90 degrees relative to each other as shown in FIGS. 3A and B.

Figure 6B:
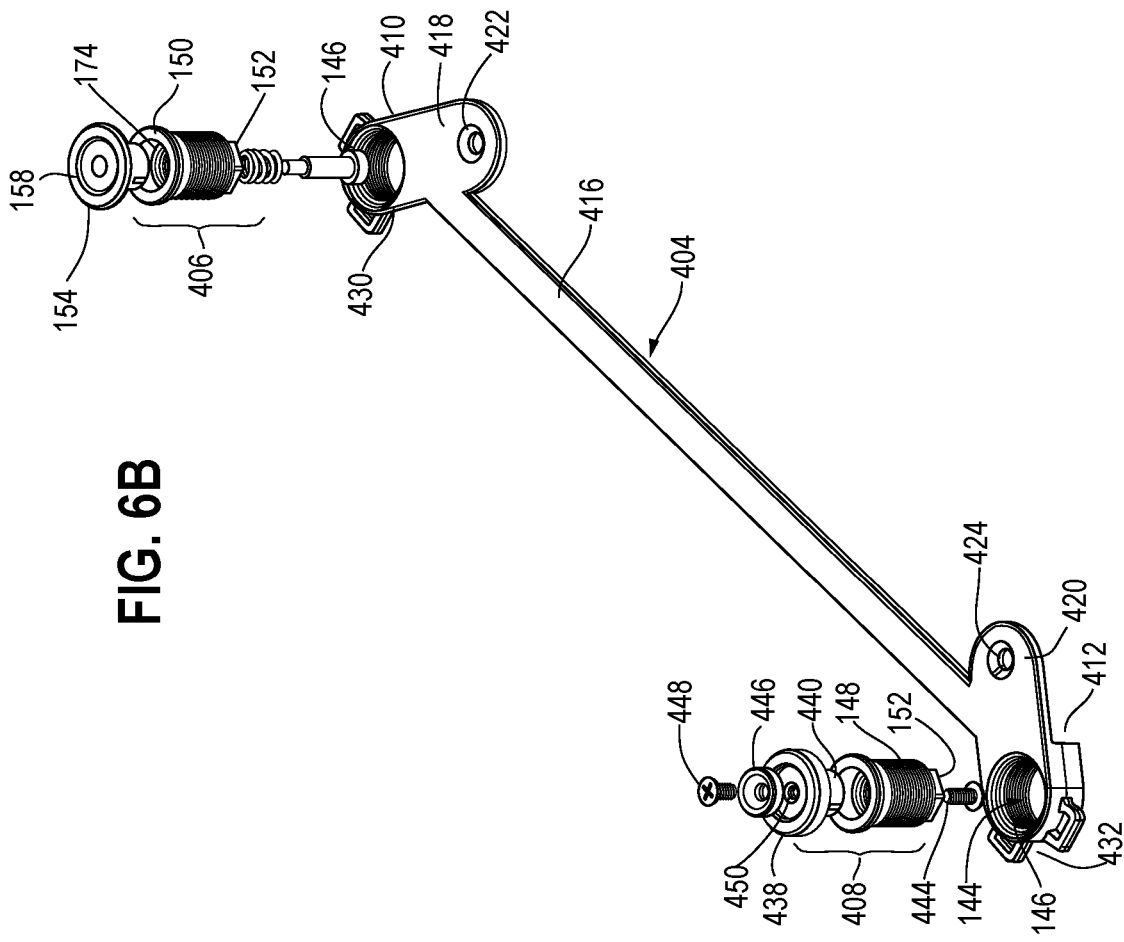
FIGS. 6A and B are exploded perspective views of alternative embodiments of a mounting member.
FIG. 6C is a side view of the mounting member assembly shown in FIG. 6B.
FIG. 6D is an exploded perspective view of a spacer.
Figure 6A:
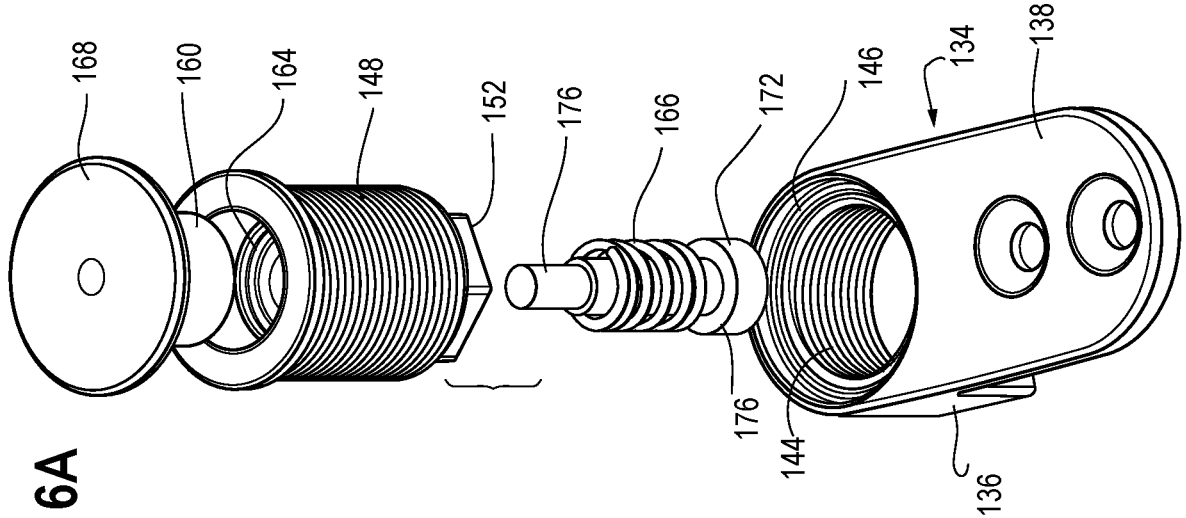
Figure 6D:
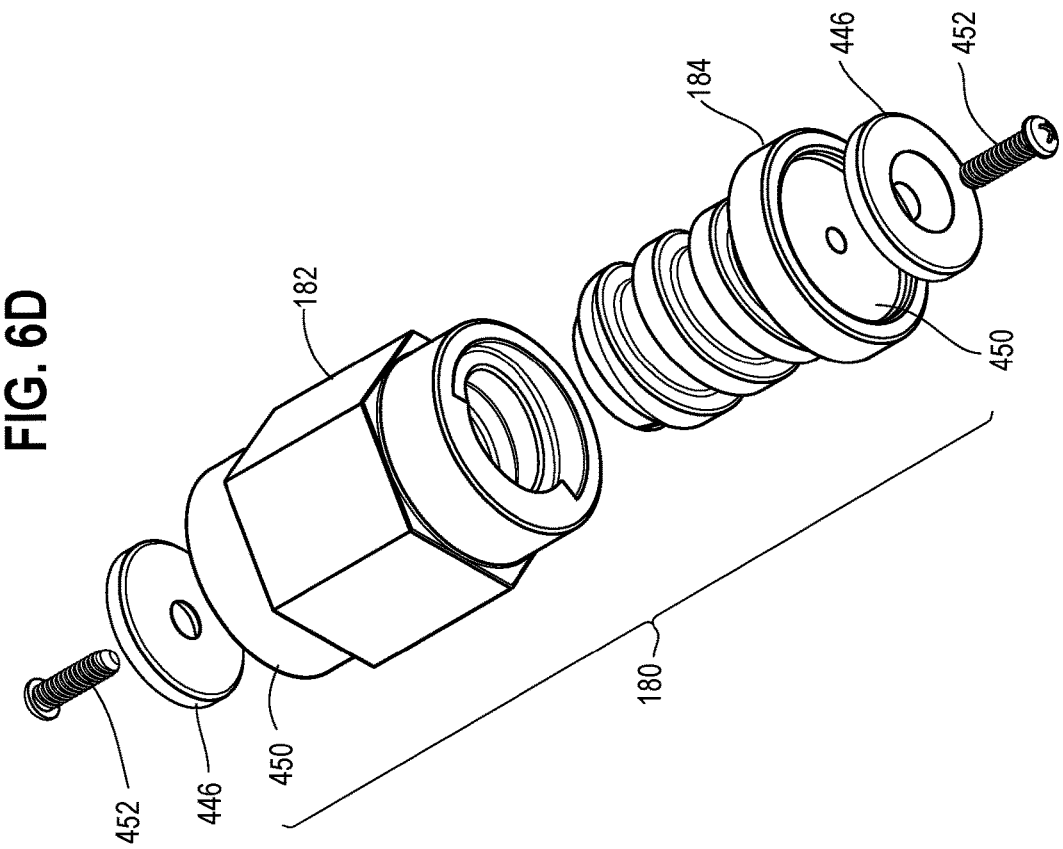
Figure 6C:
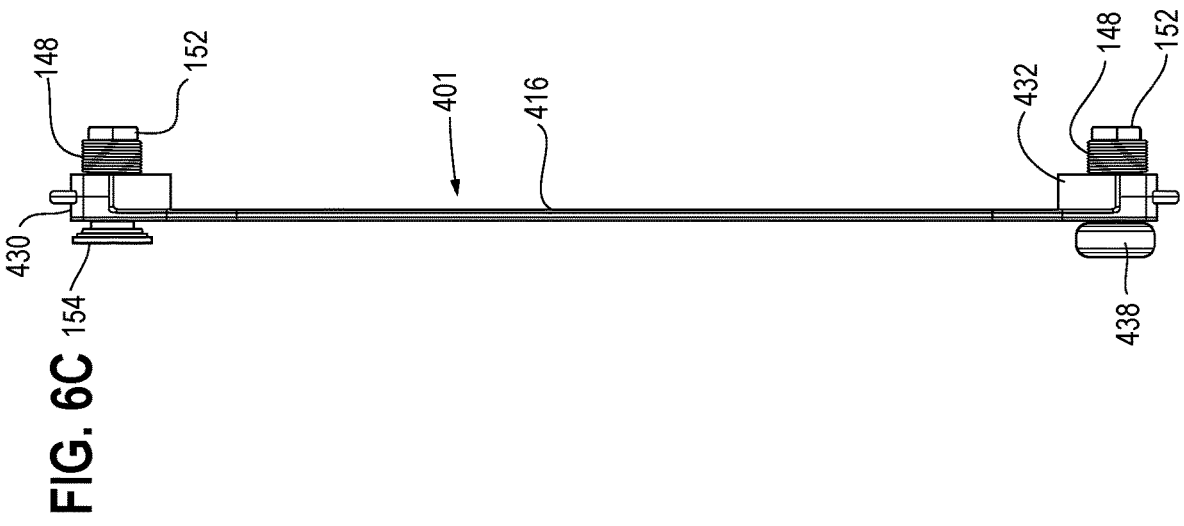
Figure 8:
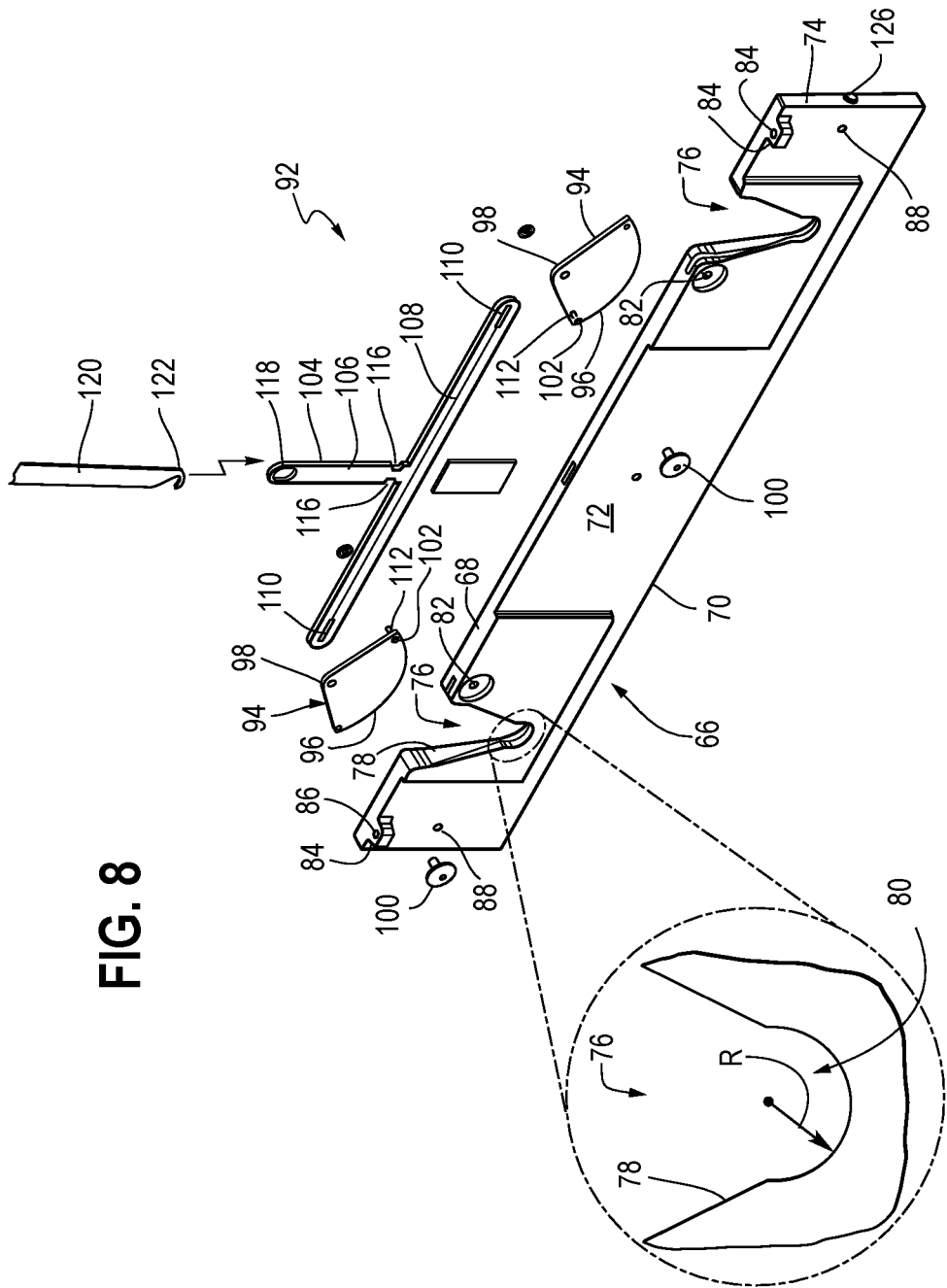
FIG. 8 is an exploded view of a support bar and locking mechanism.

In the embodiment of FIGS. 3B, 6B and 6C, right and left spanners 400, 402 interconnect upper and lower mounting members 406, 408. It should be understood that the right spanner is a minor image of the left spanner across a vertical plane. Alternatively, the left and right spanners are identical, and are simply rotated between the left and right sides. The left spanner, shown in FIGS. 6B and 6C, has spaced apart upper and lower end portions 410, 412 connected with an elongated connector 416 that is dimensioned so as to ensure the end portions are properly located relative to the plate 130 and the upper and lower rails 26, 62. Each end portion 410, 412 has a flange 418, 420 with an opening 422, 424 that overlies the plate 130, with a fastener 426 securing the flange to the plate through the opening. Each end portion also includes a hub 430, 432.

Referring to FIGS. 6A-C and 7A-C, the hubs 140, 430, 432 each have a central threaded bore 144, and an annular shoulder 146 formed at one end of the bore. A plug 148 is threadably engaged with the bore, and includes a head 150 at one end thereof that is received in the annular shoulder when the plug is fully threaded into the bore. An opposite end 152 of the plug includes a tool engageable head, for example a hex head or square head. A tool 120, including an open end wrench 800, as shown in FIG. 31, may be engaged with the head 152 to rotate the plug 148 relative to the hub 140 and thereby adjust the position of the plug relative to the hub in the lateral Z direction 4. The wrench may alternatively be configured with a closed end. A puck 154 includes an insert portion 156, configured in one embodiment with a head 158 and a neck 160, which extends into a central opening 174 formed in the head of the plug. An opposite end of the plug includes a central opening 162, with an annular lip or ridge 164 extending radially inwardly and separating the central openings. One side of the ridge forms a stop surface for the neck, while an opposite side of the ridge provides a bearing surface 178 for a spring 166. A front surface 168 of the head 158 is substantially flat, while a rear surface 170 is configured as a convex, curved surface. In one embodiment, the head 158 is configured as a disc, with a circular shaped front surface, although it may be other shapes. An elongated coupling member, 172 configured in one embodiment as a fastener, extends between the openings 162, 174 and include a first end 176 threadably engaged with the neck 160 along the Z axis 4, or with a nut 434 non-rotatably secured in the neck. A compression spring 166 is disposed between a head 176 of the coupling member and the bearing surface 178. The various mounting members may be made of metal, such as stainless steel.

In operation, the plug 148 may be rotated, for example by engagement of the head 152 with the tool 120, and in particular the open hex wrench 800 at one end of the tool, and rotated so as to move the puck in the Z-direction 4. In this way, the display support 128 may be adjusted at each of the plurality of mounting members in the Z-direction. At the same time, if the display 8 or display support 128 is pulled outwardly in the Z-direction, there is some give as the puck 154 may move away from the plug 148 against the force of the spring 166, with the spring thereafter biasing the display 8 toward the puck 154 adjacent the wall 12.

Referring to FIGS. 6B and 7C, the lower mounting member 436 includes a head 438 and a neck 440 that extends into the central opening 174 formed in the head of the plug. The neck 440 has a through opening that may be threaded, or include a threaded bushing 442 having opposite threads extending from both ends thereof. A fastener 444 extends upwardly through opening 162, through an opening defined by the annular ridge 164 and threadably engages the bushing 442 to secure the mounting member 436 to the plug 148. A magnet 446 is disposed in a circular recess 450 formed in the end of the head 438, with the magnet 446 and head having flush top surfaces 450, 452, or with the surface 450 of the magnet being slightly recessed below the surface 452 of the head. A fastener 448 secures the magnet 446 to the bushing 442.

Figure 37C:
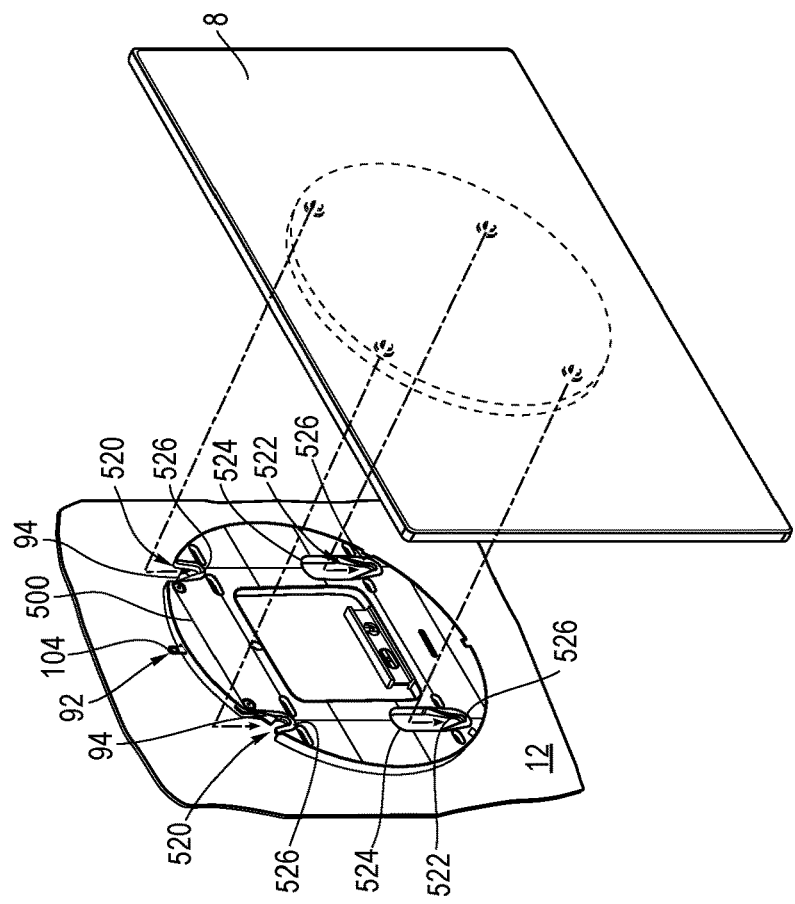
Figure 37B:
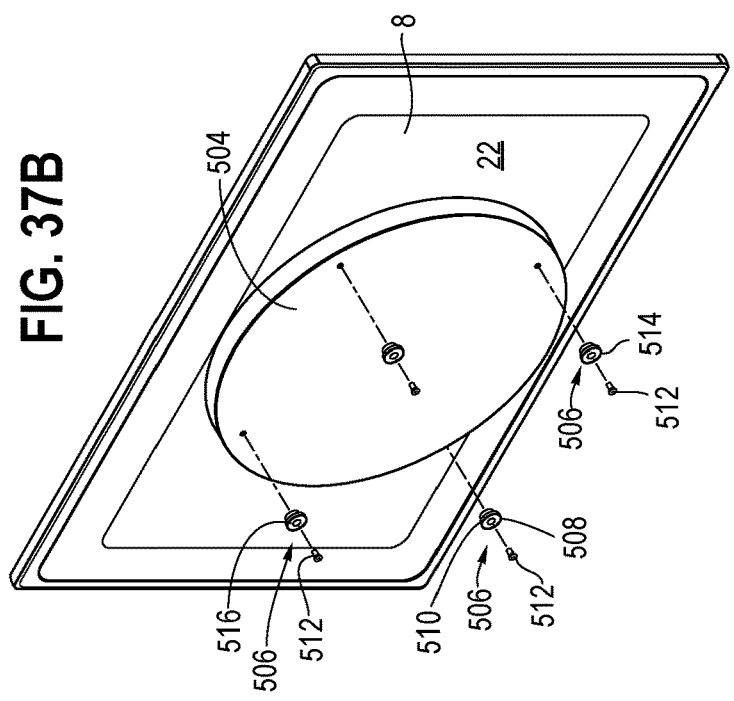

In the embodiment shown in FIGS. 37A-C, a plate 500 is mounted directly to a wall with a plurality of fasteners 502. The plate has a circumferential rim portion 544. In one embodiment, the plate has a circular shape, or a shape that matches a profile of the display support 504 secured to the rear of the display. The display support may have a plurality of mounting members 506 secured thereto, as disclosed above. In one embodiment, the mounting members 506 are configured as pucks, configured in one embodiment with a head 508 and a neck 510, with a fastener 512 securing the mounting member to the display support 504. A front surface 514 of the head 508 is substantially flat, while a rear surface 516 may be configured as a convex, curved surface. In one embodiment, the head 508 is configured as a disc, with a circular shaped front surface, although it may be other shapes. In one embodiment, the plate 500 has a central opening 509, a pair of upper V-shaped receptacles 520 opening upwardly along a periphery of the plate, and a pair of lower V-shaped receptacles 522 having an access opening 524 disposed above and communicating with the receptacles. Recesses are formed behind the receptacle 520, 522 to receive the puck head 508, and with a lower circular shaped apex 526 receiving the neck 510.

The lock mechanism 92, and in particular the release member 104 may be moved upwardly in the Y direction 6 such that the cam members 94 are not disposed across the notch receptacles 520. The release member 104 may be maintained in an engaged position, with the lock members 94 in the unlocked position, by engaging one of the catches 116 on the upright member with a pair of catches 530 defined by edges of a slot 542 formed in the top of the rim portion 544. The release member 104 may be moved to a disengaged position, where the upright member 106 is centered in the opening 114 and allowed to move downwardly therethrough to a disengaged position, with the lock members 94 pivoting to a locked position and with the convex edge 96 disposed across and closing the receptacles 520 and trapping the mounting members 506.

Operation

In operation, and referring to FIGS. 2, 3B, 35A and B, the display support 128 is secured to the rear surface 22 of the display 8. The support bars 66 are positioned in the cavity 36 of the support rail 26, with the support rail 26 being leveled (e.g. with a built in bubble level or with a separate bubble level) and thereafter secured to the wall 12 with fasteners 28. The support rail 62 is then located on the wall using the tool 120, shown in FIGS. 31-34. In particular, one end 802 of the tool, configured as a flat screw drive blade, has a first opening 804, which is disposed over a lower fastener 28 securing the rail 26 to the wall 12. The tool is allowed to hang vertically, with a second opening 806 aligned with a fastener hole on the lower rail 62. The second rail 62 may then be secured to the wall with fastener 64, which eliminates the need to level, measure and locate the second rail relative to the first rail. In this way, the rails 26, 62 are located to be aligned with the mounting members 134, 436.

With the release member 104 in an engaged position, the display support, with the display attached, is positioned such that the insert portions 156, and in particular the necks 160, of the two upper mounting members are inserted into one of the pairs of receptacles 76, or notches and settle in the bottom 80 of the opening, which is dimensioned to received and mate with the neck. The release member 104 may then be moved to the disengaged position, such that the lock members 94 pivot to the locked position and are disposed across and closes the receptacles 76 adjacent and above the necks 160, such that the insert portions 156 may not be removed from the receptacles. The rear surface 170 of the head engages a rear side surface of the support bar, or rim portion, as the neck 160 is supported in the bottom 80 of the notch to secure the display on the support bar. The convexly curved, or semi-spherical rear surface 170 of the head 158 allows for rotation of the mounting member, and the display, relative to the support bar and support rail, thereby providing for the display, e.g. bottom, to be pivoted or rotated away from the wall to provide access to a back side thereof, as shown for example in FIG. 11B.

The two bottom mounting members 436, referred to as auxiliary mounting members, and in particular the front surface 168, 450, 452 thereof engage the second rail 62, and in one embodiment, the pucks 154, or head 438, or rail 62, include a magnetic material, for example magnet 446, with the pucks or mounting member 436 being magnetically attracted to and held by the rail 62.

After the first display is mounted, the remaining displays in the array may be coupled to the support bars 66 and support rails 26, 62 in the same way.

Thereafter the adjustment members 52 associated with each display may be adjusted to ensure alignment of the displays in the Y-direction 6, for example by engaging the members 52 with the blade end 802 of the tool 120. Likewise, the adjustment member 60 maybe adjusted, for example by engaging the member with the blade end 802 of the tool, to push the displays together in the X-direction 2. Finally, each of the mounting members may be adjusted by engaging the plug 148, and in particular the head 152, with the wrench end 800 of the tool 120, such that that each display may be adjusted in the Z-direction 4. These various adjustments may be made to ensure proper X and Y alignment, as well as Z-alignment, to ensure the front surfaces 20 of the displays are flush. A single tool 120 may be used to both align and position the rails 28, 62, as well as make all of the X, Y and Z adjustments.

Figure 11B:
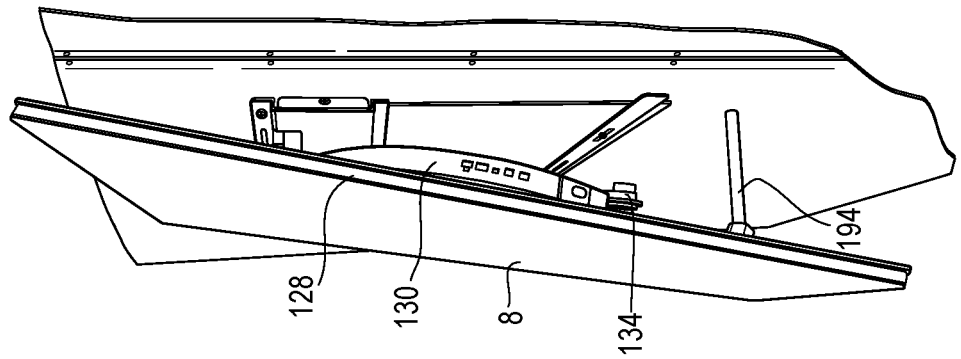
FIG. 11B shows a partial side view of a display support system with a strut disposed between the display and the wall.
Figure 11A:
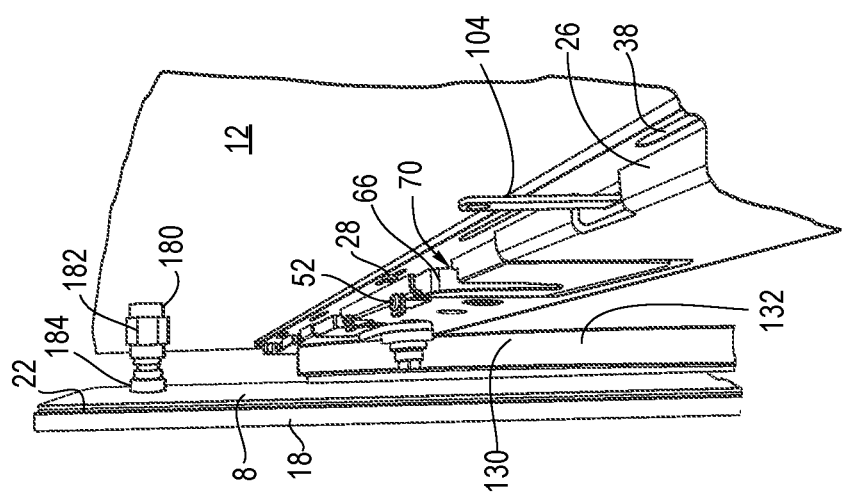
FIG. 11A shows a partial side view of a display support system with a spacer disposed between the display and the wall.
Figure 13:
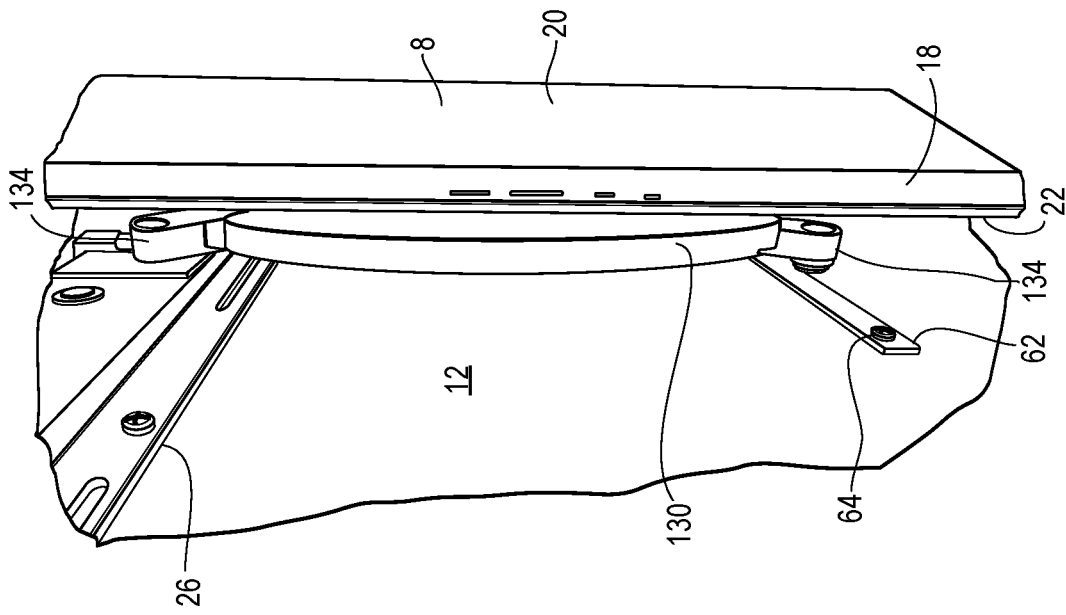
FIG. 13 is a side, perspective view of a display supported by a display support system secured to a wall.

As shown in FIGS. 6D and 11A, one or more spacers 180, each having a base 182 and an extension member 184 threadably engaged with the base 182, may be positioned between the wall 12 and the rear surface 22 of one of the displays, preferably at a location vertically spaced from the first rail 26, and on an opposite side of the first rail relative to the second rail 62. The spacer 180 may be lengthened or shortened in the lateral Z direction 4, as needed, by turning the base 183 relative to the extension member 184 to ensure the proper length of the spacer. The spacer ensures further rigidity of the display relative to the wall. The ends of the base and extension members 182, 184 may each be configured with a recess 450, with a magnet 446 disposed in the recess 450 and secured to the base and extension member with fasteners 452, e.g., mechanical fasteners such as screws, adhesive or combinations thereof. In one embodiment, the spacer 180 may be releasably coupled, for example through magnetic attraction, to one or both of the wall and display. In other embodiments, one or both of the base and extension member may be secured to the wall and display with fasteners, including mechanical fasteners such as screws, or adhesive, or combinations thereof.

Figure 10A:
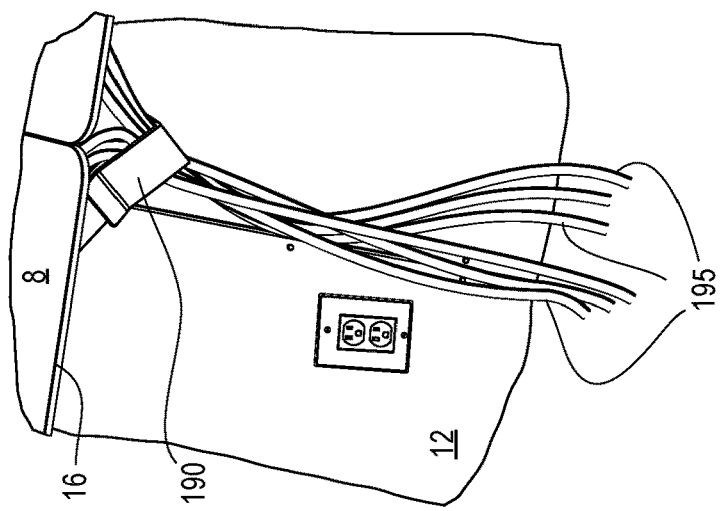
FIGS. 10A-D show the steps of installing a cable management clip on the display support system.
Figure 10B:
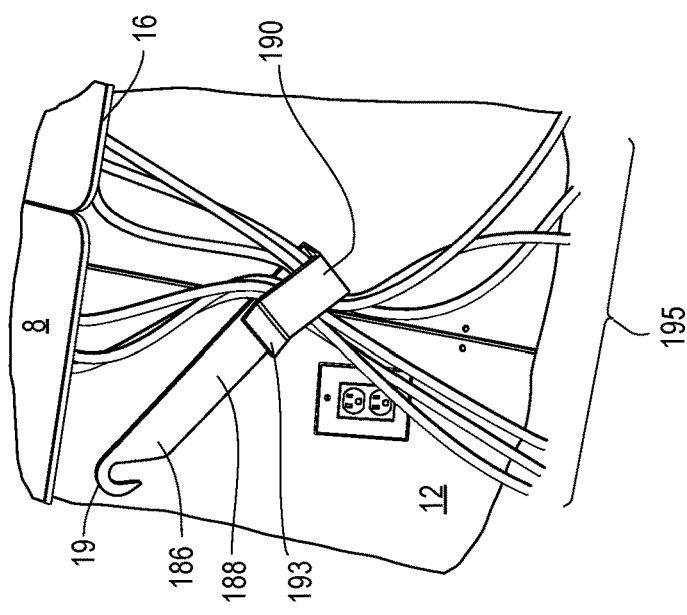
Figure 10C:
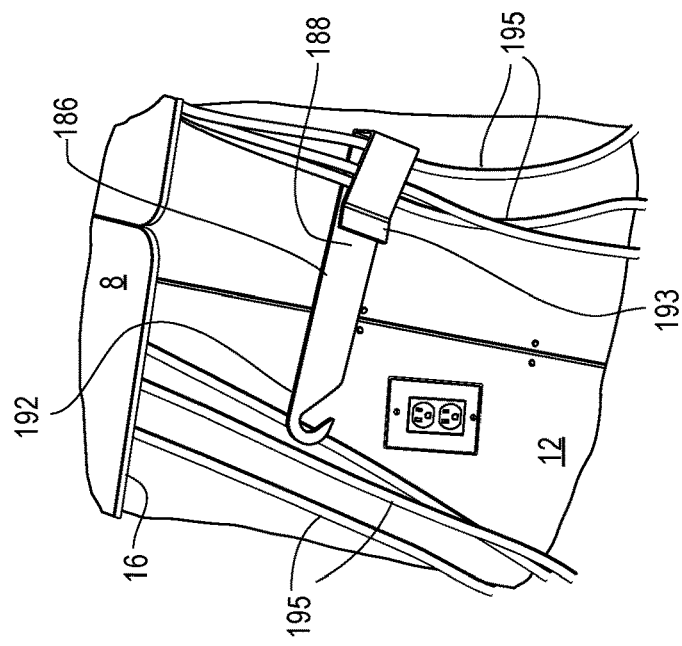
Figure 10D:
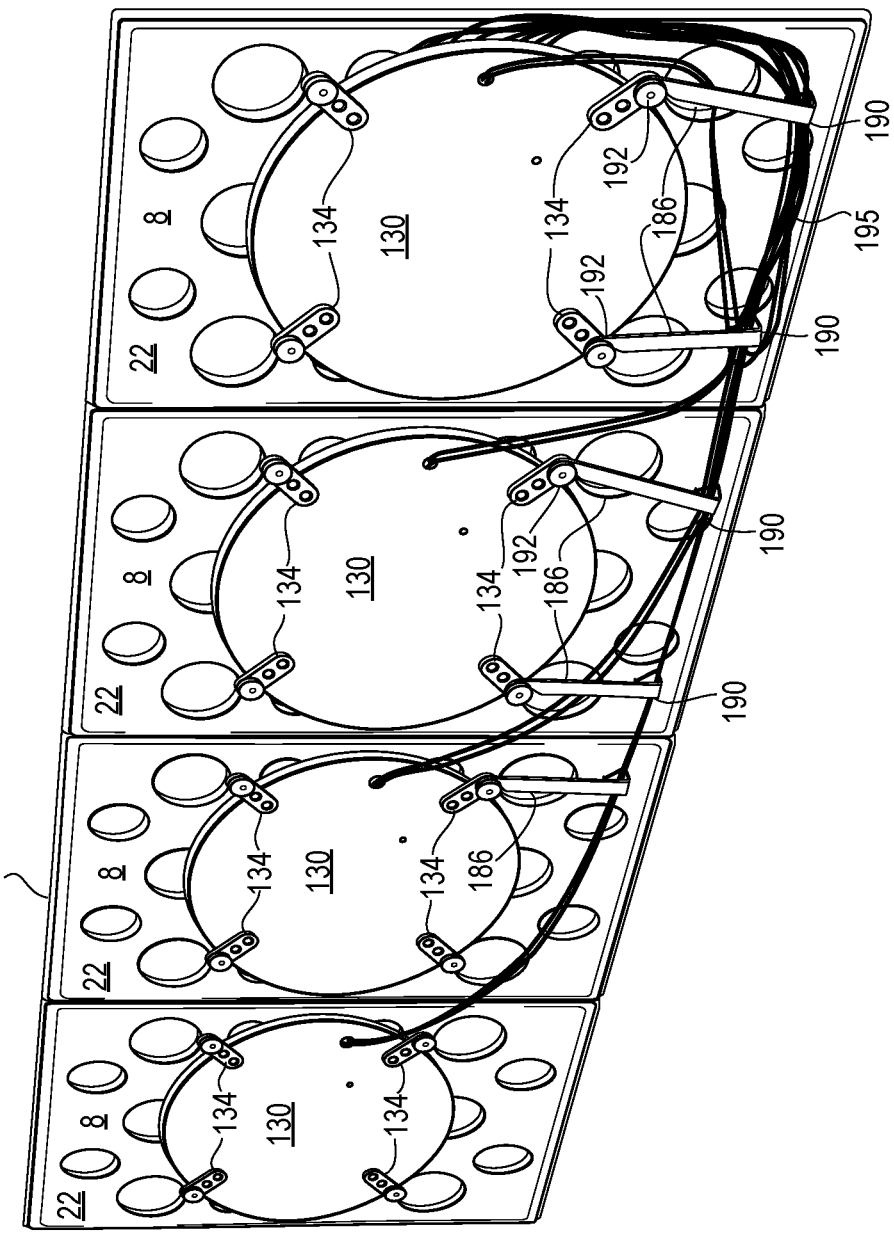

As shown in FIGS. 10A-D, 25 and 26, a cable management clip 186 includes an elongated member 188, e.g., a plate defining a plane, having a loop 190, or first hook, formed at one end and curving out of the plane of the plate, or portion of the plate adjacent the loop. A second hook 192 is formed in an opposite end within the plane of the plate, or the portion of plate within which the hook is formed. In one embodiment, the plate may have a transition 193 between the first and second portions, which may be offset, such that the end of the loop lies in the same plane as the elongated member 188. In operation, various cables 195, cords, etc. connected to and extending from the rear of the displays are gathered and held by the loop 190. The clip 186 is then manipulated such that the hook 192 is engaged on the neck 160 of the puck as shown in FIG. 10D, with the loop 190 opening towards the rear of the display. To facilitate this operation, the displays 8 may be tilted away from the wall 12 by disengaging the lower pucks 154, 436 from the lower rail 62 to provide access to the bottom of the display and the lower pucks, with the curved surface 170 of the heads of the upper pucks allowing for the tilting of the display as explained previously.

In one embodiment, shown in FIG. 11B, the display support includes a strut 194, or kickstand, that may be rotated to engage the lower rail 62, or other portion of the support wall, and hold the display support away from the wall at an angled orientation, either for viewing or to provide room for an installer to have hands-free access to the rear of the displays 8 while installed on the wall 12.

Referring to the embodiment of FIGS. 37A-C, the display support 504 is secured to the rear surface 22 of the display 8, with mounting members 506 secured to the display support 504. The plate 500 is then located on the wall using a bubble level 503, which is supported on a bottom edge 511 of opening 509. The plate 500 is mounted on the wall with fasteners 502. With the release member 104 in an engaged position, the display support, with the display attached, is positioned such that the two upper mounting members 506 are inserted into the receptacles, or notches and settle in the bottom 526 of the opening, which is dimensioned to received and mate with the neck. At the same time, the lower mounting members 506 are inserted into the access openings 524 and are thereafter lowered into the lower receptacles 522 and settle in the bottom 526 of the opening. The release member 104 may then be moved to the disengaged position, such that the lock members 94 pivot to the locked position and are disposed across and closes the receptacles 520 adjacent and above the necks, such that the mounting members 506 may not be removed from the receptacles. The rear surface 516 of the head engages a rear side surface of the plate 500 as the neck is supported in the bottom of the notch to secure the display on the plate.

Support Cart

Referring to FIGS. 14-24, 27-30D and 36A-G, a support cart 200 includes a frame 202 having a pair of spaced apart side supports 204 each defining an apex 206. In one embodiment, the frame has an A-frame configuration, with each of the side supports having an inverted V-shape. The side supports include a pair of legs 208 having upper ends 210 joined at the apex 206. Lower ends of the legs have floor engaging components 212, such as glides, wheels and/or casters. In one embodiment, each of the legs is configured as a leg tube, which may have a cylindrical exterior shape having an annular, or circumferential side wall 214 having a thickness and a central opening.

Figure 25:
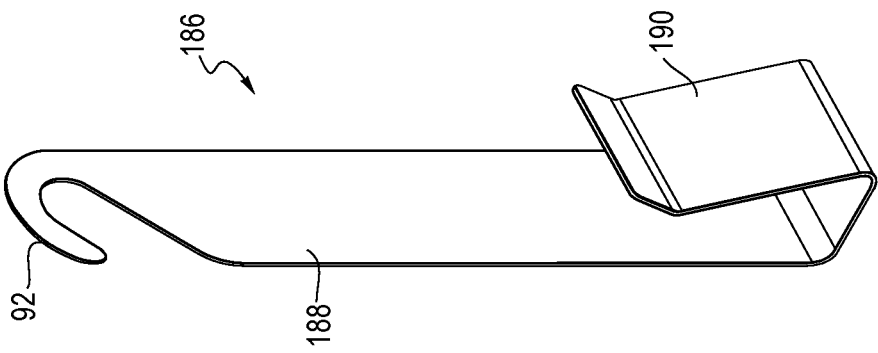
FIG. 25 is a perspective view of one embodiment of a cable management clip.

Referring to FIG. 25, the floor engaging component 212 includes a housing 560 and a wedge 562 extending upwardly from the housing. The wedge member has a lower wedge member 564 and an upper wedge member 566 with angled interfacing surfaces 568, 570 forming an acute angle relative to a vertical plane. The wedge members may be made of metal, for example steel or aluminum, or of plastic. The wedge members 564, 566 are inserted inside the bottom of the leg tube 208. A fastener 568 extends upwardly from the housing 560 through the lower wedge member 564 and threadably engages the upper wedge member 566. As the fastener 568 is rotated, the upper wedge member 566 is drawn downwardly, and slides radially outwardly relative to the lower wedge member 564, with the surfaces 568, 570 sliding relative to each other. As the wedge members 564, 566 are displaced radially (or laterally and longitudinally) relative to each other, the outer circumferential surface of each wedge member 564, 566 bears against the interior surface of the leg tube thereby securing the housing to the leg. A caster 580 having a mounting member 582 may thereafter be secured to the housing, for example by inserting the mounting member into a receptacle formed in the housing along an axis laterally offset from the axis of the leg tube. In this way, the caster is secured to the leg with a seamless appearance, and without any externally visible fasteners extending radially through the leg.

A bracket 216 includes a cap 220 surrounding and joining the top end of the legs at the apex, with a mounting portion 218, configured as a plate or flange, extending transversely to a plane defined by the legs. The bracket fits over and covers the top of the legs, and includes an insert portion 221 that fits inside each leg. The cap has an interior cavity 225 that is covered with a cover 223. A wedge 562 is secured to the end of each insert portion 221, with a fastener 561 extending through the cavity 225 and engaging the wedge 562 to secure the cap to the legs 208, with the wedge functioning as described above. Again, the cap is installed seamlessly and without any externally visible fasteners.

A plate 224 is coupled to the mounting portions 218 of the brackets, for example with fasteners 226, and extends between the opposite side supports. In one embodiment, the plate has a circular shape, or a shape that matches a profile of the display support 504 secured to the rear of the display 8. The display support 504 may have a plurality of mounting members 506 secured thereto, as disclosed above. In one embodiment, the plate 224 is secured to the side supports at the outermost portion of the plate, or across a diameter thereof, such that the plate is vertically centered between the side supports 204.

Figure 16:
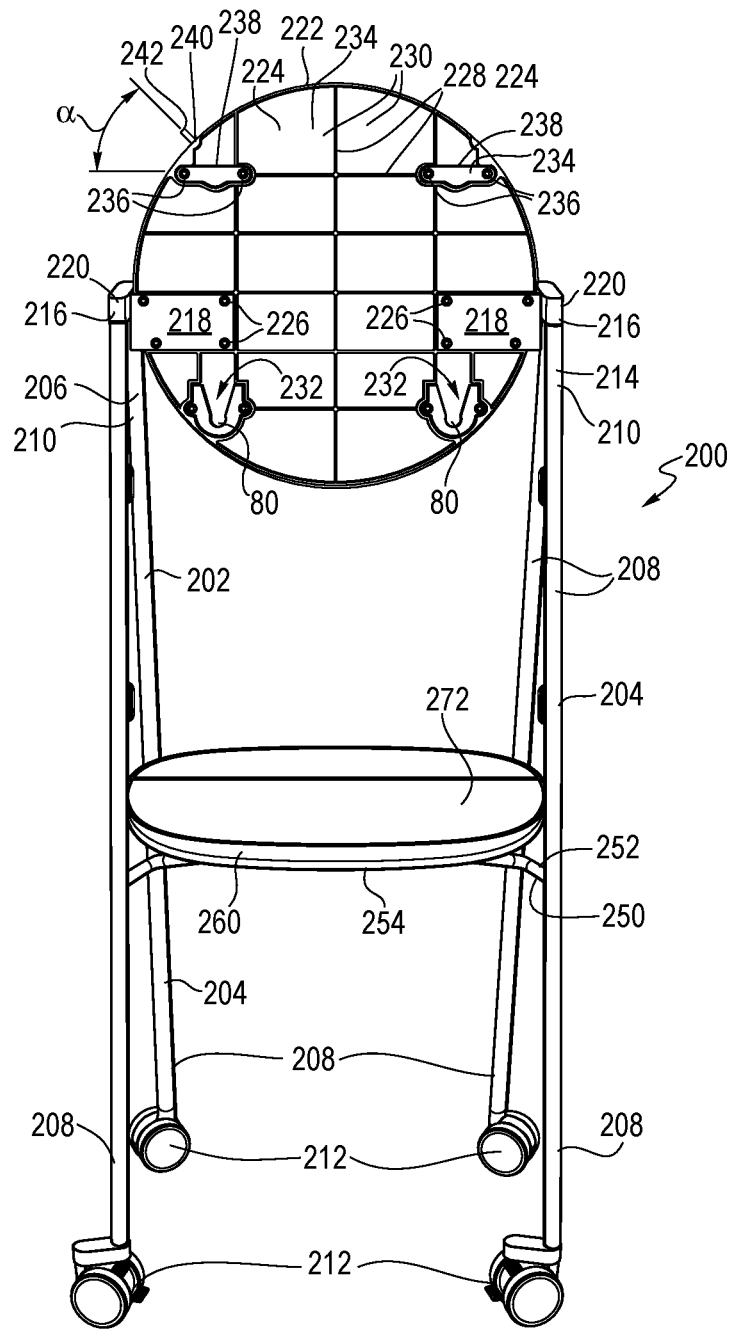
FIG. 16 is a partial front view of the support cart without a display secured thereto.

As shown in FIG. 16, in one embodiment, the plate 224 includes a circumferential rim portion 222 and a plurality of vertical and horizontal ribs 228 that provide rigidity to the plate and define a plurality of recesses 230 on the front surface thereof. The ribs may be linear, or have other shapes and configurations. A plurality of receptacles 232, 234 are defined by and nested between the ribs, with the face of the receptacles lying flush with the front surface of the plate. Two lower receptacles 232 are disposed beneath upper receptacles 234. The receptacles are secured to the plate 224 with fasteners 236. A pair of lower V-shaped receptacles 232 each define a notch, with a recess formed behind the receptacle to receive the puck head 158, and with a lower circular shaped apex 80 receiving a neck. The upper receptacles each define a notch 238, also with a recess formed behind the receptacle, with the notches being are more shallow in a vertical direction than the notches of the lower receptacles 232.

A boss structure 240 is formed in the circumferential rim and includes a through opening diagonally aligned with the notches 238 in the upper receptacle, with the angle ($\alpha$) of the opening being acute relative to the horizontal and vertical axis, and 45° in one embodiment. It should be understood that the opening may extend at other angles, including along a vertical axis.

In one embodiment, the heads 158 of the pucks mounted to the display support are received in the recesses behind the receptacles 232, 234, with the necks 160 of the pucks disposed in the apex of the notches. Lock members, configured in one embodiment as set screws 242, are then threaded through the through openings and abutted against the necks 160, or the circumferential edge of the puck or mounting member 506, to secure the display support, and display, to the plate.

Figure 19:
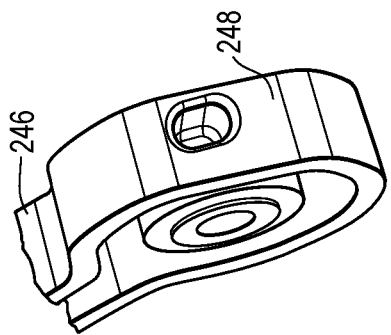
FIG. 19 is a partial perspective view of an end portion of the mounting cross member.
Figure 18:
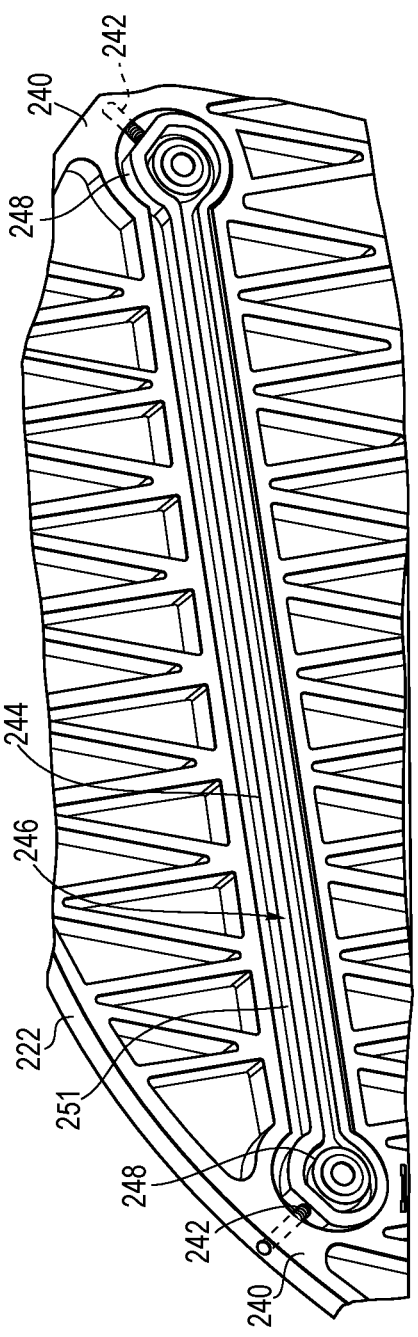
FIG. 18 is a partial, front view of a mounting cross member secured to a plate on the support cart.

In another embodiment, shown in FIGS. 18 and 19, a mounting cross member is secured to the rear of a display or display support with fasteners. In one embodiment, the cross member 244 as a dog-bone shape, with an elongated support 246 and opposite enlarged end portions 248, which are secured to the display support or display. The cross member, including the enlarged end portions, are disposed in a recess 251 defined in the plate 224 by the ribs 228. Lock members 242 extend through threaded through openings to engage the end portions 248 and secure the display 8 or display support 128 to the plate 224.

Figure 20:
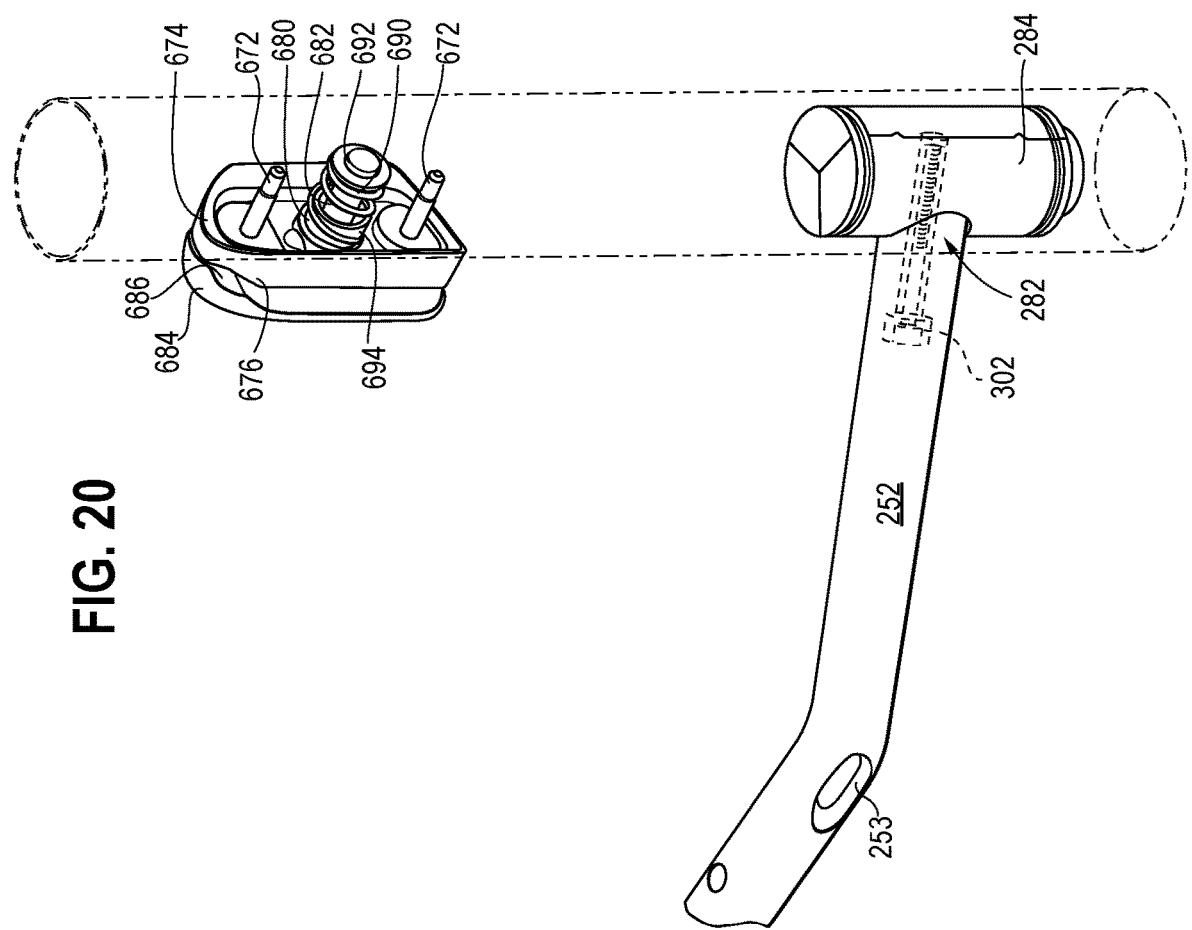
FIG. 20 is a partial perspective view of a tube-to-tube connection on the support cart frame.
Figure 26:
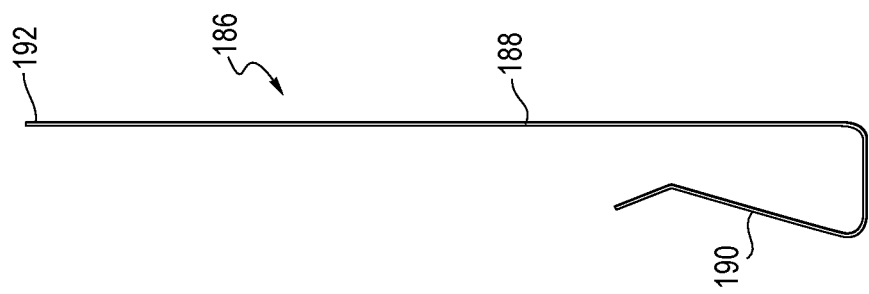
FIG. 26 is a side view of the cable management clip.

Referring to FIGS. 14, 15, 17, and 36A-G, the legs 208 of each of the spaced apart side supports are joined by a pair of support members 250, configured as support tubes in one embodiment, although it should be understood that the support members may be solid, for example configured as bars. Each support tube extends between a pair of legs 208 forming each side support. Each support tube has a pair of end portions 252 that extend diagonally from the legs, meaning longitudinally and laterally, for example at an angle ($\beta$) relative to a longitudinal axis 2 defined in a horizontal plane. Each support tube further includes an intermediate connecting portion 254, with the connecting portions of the two support tubes being parallel and extending in the lateral direction 4 while being spaced apart in the longitudinal direction 2, or vice versa. The support tubes preferably lie in a horizontal plane. Each of the end portions 252 of the support tube has an access opening 253 formed at the junction with the connection portion 254, which allows for a tool, e.g., screw driver, Allen wrench or socket extension, to be inserted through the interior of the end portion 252 and engage a fastener 302 as shown in FIG. 20.

Figure 17:
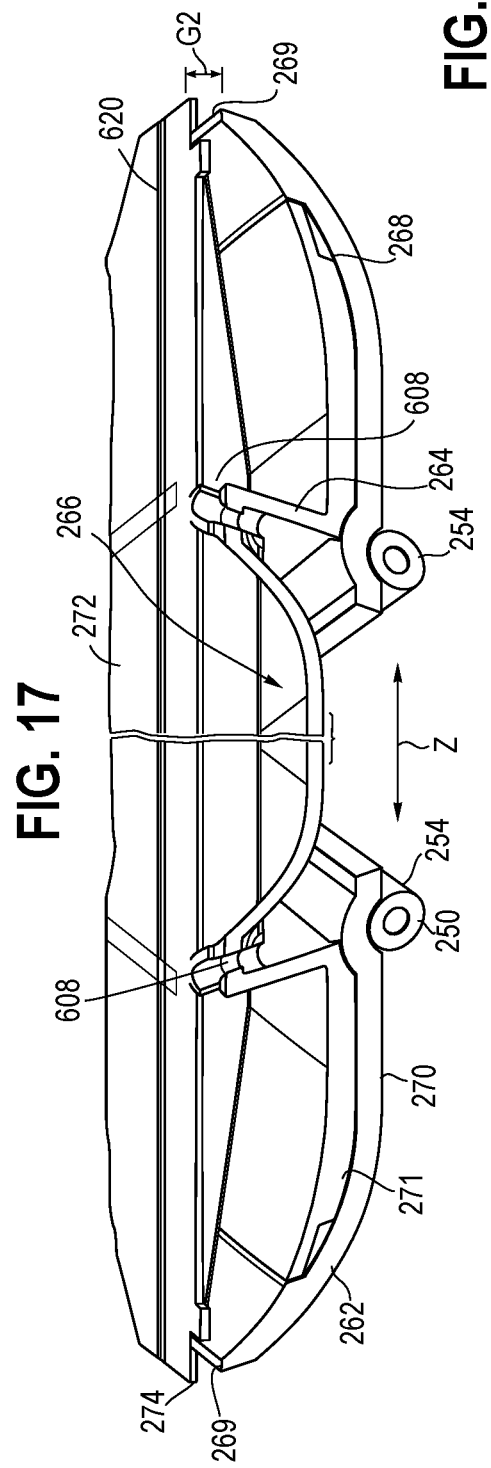
FIG. 17 is a cross-sectional view of the tray mounted to the support cart.

A tray 260 is carried by the support tubes and defines the cross portion of the A-frame configuration. The tray has a lower base portion 262 defining a central recessed cavity 267. The tray further includes an upper portion 295 coupled to the lower base portion with fasteners 293, with the upper portion 295 having an inner wall 264 defining a central recessed cavity 266, and a circumferential or annular trough 268 surrounding the cavity 266. It should be understood that the trough is not circular in one embodiment, but rather has an elongated or obround shape. The tray, and in particular the base portion 262, may include a bottom floor 270, or a pair of floors, defining an outer peripheral edge 269 of the trough as shown in FIG. 17, with the upper portion 295 having an insert portion 271 disposed on the bottom floor and defining the wall and cavity. The floor 270 is supported on and coupled to the support tubes 250, and in particular the connecting portions 254 thereof, and secured thereto with fasteners 281. In other embodiments the recessed cavity and trough are integrally formed from a single, homogenous member.

A lid 272 is pivotally connected to the tray, for example to the inner wall 264. As shown in FIG. 15, the lid may be asymmetric, with a front portion pivotally connected to a rear portion and covering a larger portion of the cavity when pivoted to a closed position, or as shown in FIG. 14, the pivot axis, or living hinge, may be symmetrically located along a centerline of the lid. In an open position, the lid or cover, with the front portion, rear portion, or both, leaves portions of the cavity uncovered. The peripheral edge 274 of the lid is spaced above the peripheral edge of the trough, providing a gap G2, or pass through therebetween. In this way, cords, cables 275 and the like may be inserted through the pass through and wound around the inner wall 264 and disposed in the circumferential trough 268 for storage. At the same time, various accessories, such as wireless control devices, writing implements and the like, may be stored in the central cavity 266, covered by the lid 272 when in a closed position.

Figure 29:
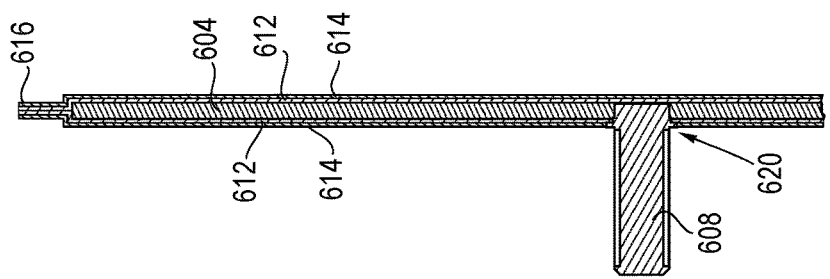
FIG. 29 is a cross-sectional view of the lid taken along line 29-29 of FIG. 27.
Figure 28:
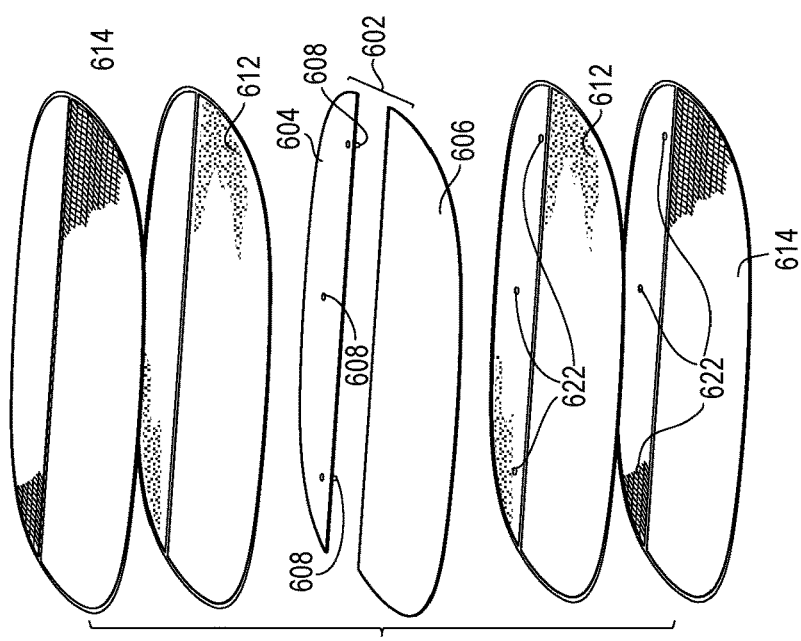
FIG. 28 is an exploded view of the lid.
Figure 27:
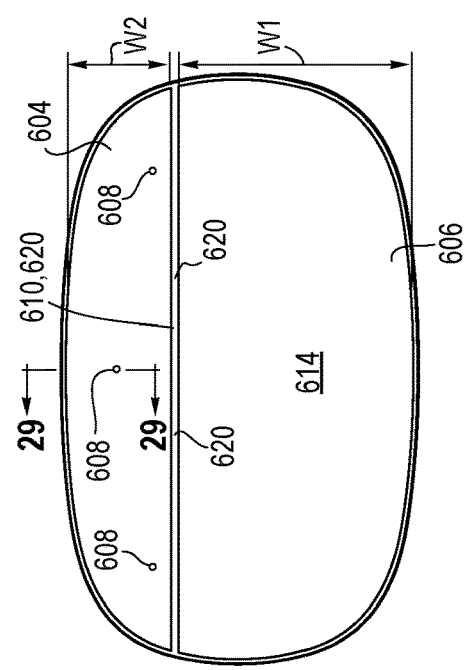
FIG. 27 is a bottom view of a lid for a tray.

Referring to FIGS. 27-29, the tray and lid may be made of composite laminate structure, including a base layer 602 configured with a steel section 604 aligned and positioned adjacent an aluminum section. The steel section is configured with a plurality (shown as 3) studs 608 extending orthogonally from the steel section. The steel and aluminum sections are spaced apart to form a seam 610, with both sections lying in the same plane. The seam 610 may be symmetrical to the overall shape, or asymmetrical, as shown in FIGS. 27-29, for example with the aluminum section 606 having a greater width w2 than the width w1 of the steel section 604. A sheet adhesive layer 612 is applied to each side of the base layer, and outer fabric layers 614 are applied to the sheet adhesive layers, with the adhesive and fabric layers extending beyond the edge of the base layer to form a perimeter edge 616. The lower adhesive layer and fabric layer have openings 622 aligned with and receiving the studs 608, while the upper layers cover the studs. The lid is secured to the tray with the studs 608, which may be engaged with the upper portion by nuts, friction fit, snap fit or other fasteners. The sheet adhesive layers and fabric layers define a living hinge 620 between the steel and aluminum sections along the seam 610.

Referring to FIGS. 15 and 20-22B, the end portions 280 of the support tubes are inserted through a side opening 282 formed in the leg tubes, such that the end portions extend into an interior of the leg tubes. A cylindrical wedge 284 is inserted interiorly of the leg tube in the central opening. The wedge has a first, second and third sectors 288, 290, 292.

The cylinder has a pair of longitudinally spaced circumferential grooves 291, with a pair of O-rings 286 disposed in the grooves to hold the sectors together, e.g., bias the sectors toward each other. The outer surface of the O-rings 286 is flush with, or spaced radially inwardly from the exterior surface of the wedge. Sectors 288 and 290 have ridges 295 that are received in and aligned with grooves 297 that align the sections, but allow relative sliding therebetween.

A stud or nipple 289 extends axially from an end of the wedge 284 along a centerline thereof as shown in FIGS. 21A, B, D and E, with key members 293 also extending axially from the end of the wedge at locations disposed radially outwardly from the nipple 289. Referring to FIGS. 38A and B, a tool 900 includes an elongated member, configured as a rod or tube 902, which is dimensioned to be received in the interior of one of the leg tubes 208. The tool 900 includes a grippable handle 904 at one end of the tube and an interface element 906 at the other end. The interface element 906 includes a center opening 908 with one or more radially moveable detent elements 910, which are biased radially inwardly into the opening 908 for example with springs. The opening 908 is dimensioned to receive the nipple 289. The end of the interface element is configured with a rim portion 914 defining the center opening, and includes a pair of slots 912, or key passageways, that are circumferentially spaced and sized to engage the key members 293 on the wedge member. In operation, the interface element 906 is releasably engaged with the wedge 284 by inserting the nipple 289 into the opening 908, with the detent members engaging a groove on the nipple 289 to hold the wedge 284 on the tool 900. The key members 293 are received in the slots 912 to orient the wedge 284 and prevent it from rotating relative to the tool about the axis thereof. The tool 900 and wedge 284 are inserted into the leg tube 208 until the wedge 284 is positioned with an opening 294 aligned with the opening 282 in the leg tube 208. After the wedge 284 is engaged with a fastener and/or support tube extending laterally through the opening 282 as described hereinafter, the user may pull axially on the tool 900 to overcome the detent member 910 biasing force and release the tool 900 from the wedge 284, whereinafter the tool 900 may be extracted from the leg support tube 208.

The first and second sectors 288, 290 have a first opening 294 defined at the interface therebetween, with the first opening extending radially inwardly and defining an annular shoulder 298. The end portion of one of the support tubes 252 is inserted into the first opening and engages the shoulder. A second opening 296 is co-axial with the first opening and extends through the remaining portion of the first and second sectors. A third opening 300 is co-axial with the first and second openings 294, 296 and is formed in the third sector 292. A fastener 302 extends through the end portion of the support tube and threadably engages the third sector at the third opening. As the fastener is tightened by rotation, the third sector 292 is drawn toward the first and second sectors 288, 290, with the sliding interface therebetween causing the first and second sectors to separate and engage the interior surface 304 of the leg tube. At the same time, the end portion 252 of the support tube is drawn against the wedge 284, and in particular the shoulder 298, thereby securing the support tube to the leg tube. In this way, the tube-to-tube 208, 252 connection is provided with a seamless appearance, with the end of the first tube 252 disposed interiorly of the second tube 208, giving the appearance of a permanent connection, e.g., welded, but allowing for the quick and easy disassembly of the components.

Referring to FIGS. 20 and 30A-D, a wire management clip 670 includes a base member 674 secured to a leg tube 208 with a pair of fasteners 672. The base member 674 has an elongated obround shape, with an outwardly facing longitudinally extending groove 676 running the length of the base member and configured with a concave curvature to accommodate a cord 678. The base has a hub 680 extending from a rear side of the base member, with a through opening 682 formed in the hub.

A clamping member 684 has a corresponding elongated obround shape with an inwardly facing longitudinally extending groove 686 running the length of the clamping member. The grooves face each other and define a channel 688 extending through the clip. The clamping member 684 includes a post member 690 that extends through the opening in the base member. The leg may have an opening to accommodate the hub and post. A head, or retention member 692, is secured to the end of the post. A spring 694 is disposed between the retention member 692 and the base, and is disposed around the hub 680 in one embodiment. In one embodiment, the spring is a coiled compression spring, although it should be understood that other types of springs, including leaf springs and tension springs would also work.

Figure 30D:
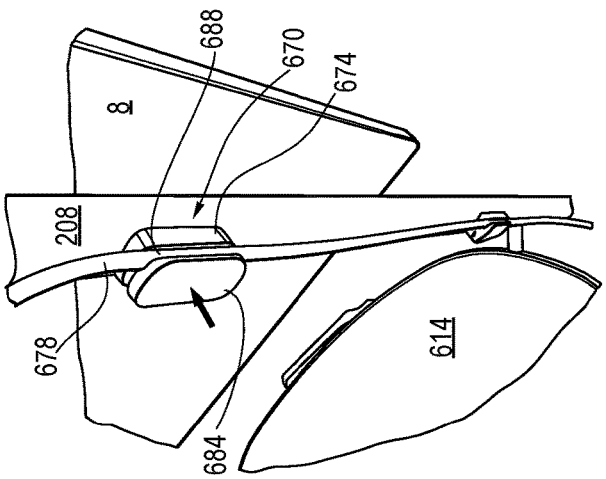
FIGS. 30A-D are perspective views of a wire management clip being manipulated to capture a cord.
Figure 30B:
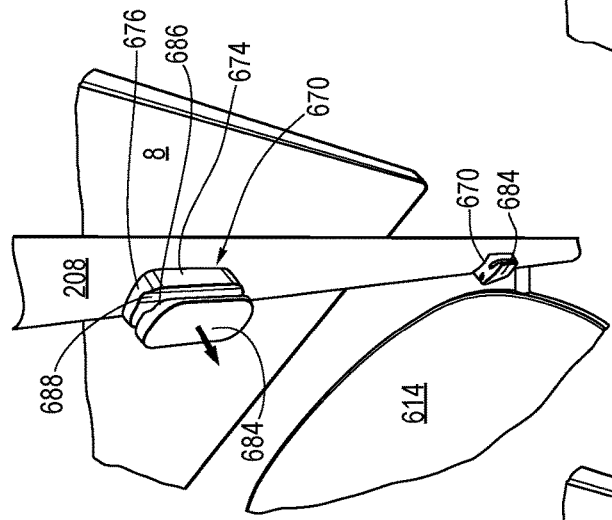
Figure 30C:
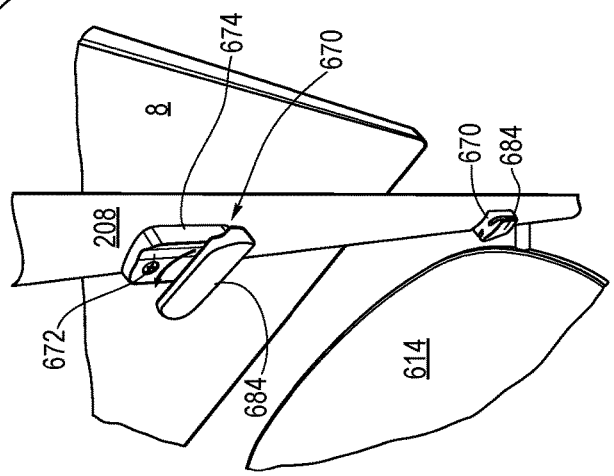
Figure 30A:
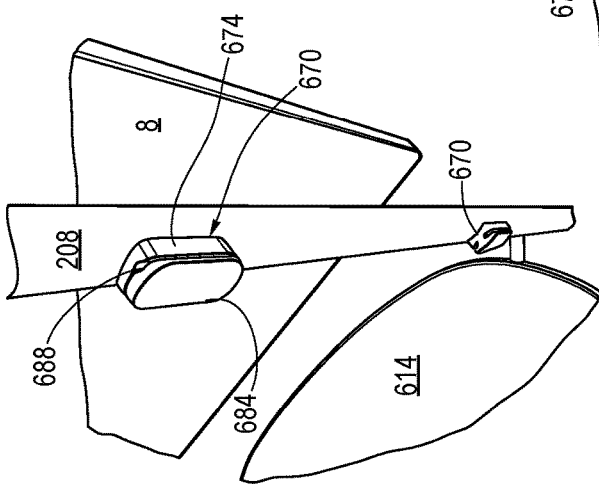

In operation, the user may grasp the clamping member 684 and pull it away from the base member 674 against the return force of the spring 694. The clamping member may also be rotated relative to the base member as shown in FIG. 30C. A cord 678, shown in FIG. 36F, may be inserted in the channel 688, with the clamping member thereafter being rotated such that it is in alignment with the base member and thereafter released, with the return force of the spring clamping and holding the cord 678 between the clamping member 684 and the base member 674.

Referring to FIGS. 20, 39A-C and 40, an alternative embodiment of a wire management clip 770 includes a base member 774 secured to a leg tube 208 with a pair of fasteners 672. The base member 774 has an elongated obround shape, with a pair of outwardly facing and parallel longitudinally extending grooves 776, 777 running the length of the base member and each configured with a concave curvature to accommodate a cord 778, 779. A convex center ridge 769 or apex extends longitudinally between the grooves. The grooves may have the same or different curvatures, for example different radii, or with more or less depth. The base has a hub 780 extending from a rear side of the base member, with a through opening 782 formed in the hub to receive a post 772. A rear surface of the base is configured with a concave surface 773 shaped to mate with a convex outer surface of the leg tube 208.

A clamping member 784 has a corresponding elongated obround shape with a pair of inwardly facing longitudinally extending grooves 786, 787 running the length of the clamping member, and a center groove 767 disposed between the grooves 786, 787. The groove 767 is shaped to mate with, and has a similar curvatures as, the center ridge 769. The grooves 777/787 and 776/786 face each other and define a pair of channels 788, 789 extending through the clip. The clamping member 784 includes a pair of longitudinally spaced hubs 790 defining a pivot axis 791 extending orthogonal to the axis of the post 772 and the axes of the channels 788, 789. An end 793 of the post defines an axle 795 received in the hubs and further defining the pivot axis 791. The leg 208 may have an opening to accommodate the hub 780 and post 772. A head, or retention member 692, is secured to the end of the post. A spring 694 is disposed between the retention member 692 and the base, and is disposed around the 780 in one embodiment. In one embodiment, the spring is a coiled compression spring, although it should be understood that other types of springs, including leaf springs and tension springs would also work.

Figure 39A:
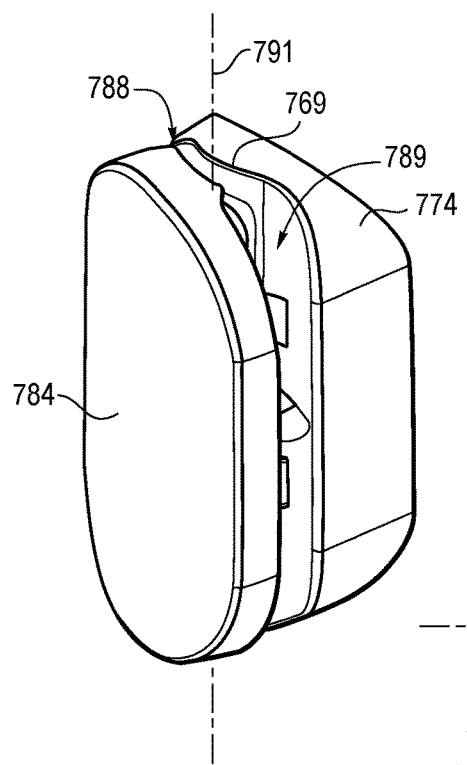
FIGS. 39A-C are perspective, side and top views respectively of an alternative embodiment of a wire management clip.
Figure 39B:
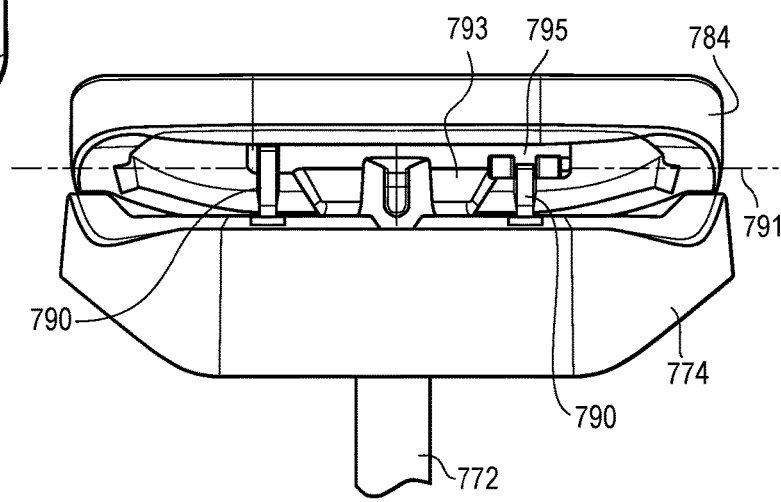
Figure 39C:
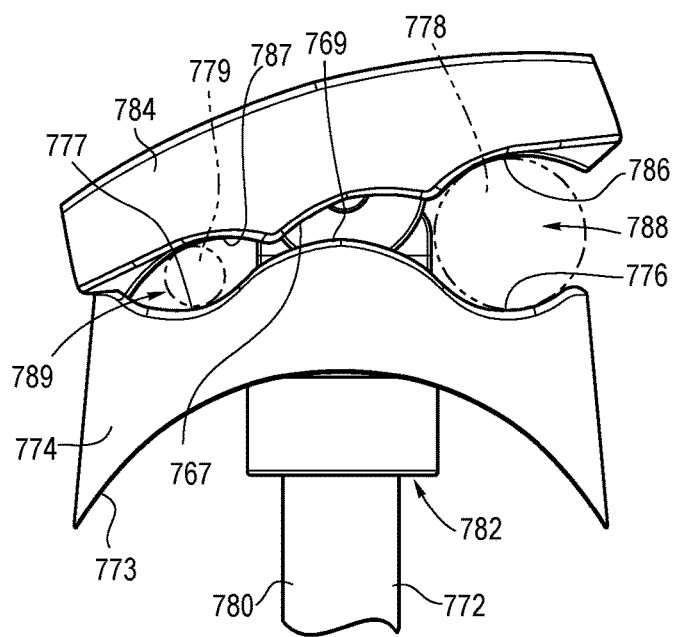
Figure 40:
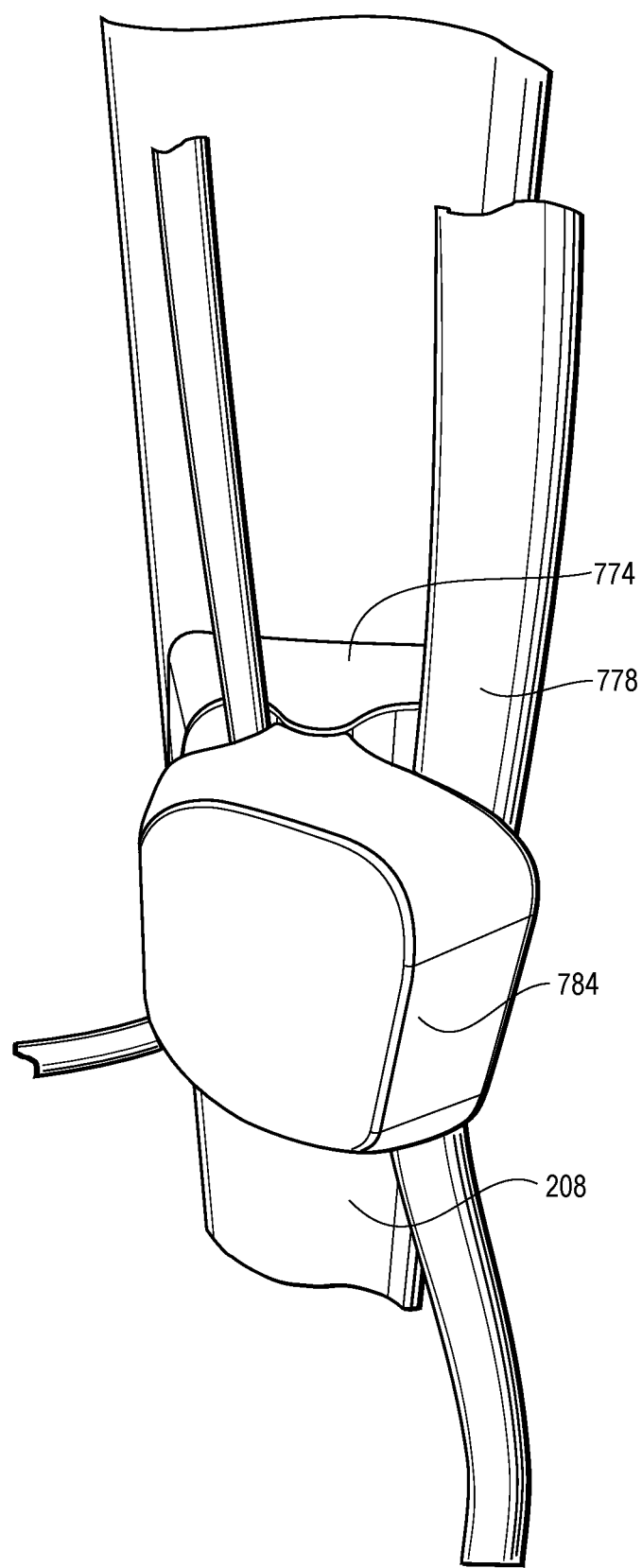
FIG. 40 is a partial perspective view showing the wire management clip of FIGS. 39A-C secured to a leg.

In operation, the user may grasp the clamping member 784 and pull it away from the base member 774 against the return force of the spring 694. The clamping member may also be pivoted about the axis 791 relative to the base member as shown in FIG. 39C so as to accommodate different size (e.g., diameter) cords 778, 779. The clamp member may be biased against only a single cord disposed in one of the grooves, against the base member if no cords are present, or against a pair of cords of equal or different diameters. One or more cords 778, 779, shown in FIGS. 39C and 40, may be inserted in the channels 788, 789 with the clamping member thereafter being released such that it is biased toward the base member. The return force of the spring clamps and holds the cords 778, 779 between the clamping member 784 and the base member 774, with the clamping member free to pivot about the pivot axis 791 to accommodate different sized cords. In a configuration without any cords, the ridge 769 is biased into engagement with the groove 767. When cords are present, the ridge may be separated from the groove, and/or one or both of the side edges of the clamping member may be biased against one or both of the side edges of the base member. The clamping member and base member may accommodate cords of various sizes, including without limitation a 2.5 mm diameter USBC cord and an 8.0 mm diameter AC power cord, and various cords having diameters between 2.5 and 8.0 mm.

Referring to FIGS. 36A-G, the support cart may be easily assembled from, and disassembled into, a knock-down configuration by coupling or decoupling the plate 224 from the side supports 204 (FIGS. 36A and B), attaching or removing the base portion 262 of the tray 260 (FIG. 36C) to stabilize and connect the side supports, attaching or decoupling the display 8 from the display support 130 (FIG. 36D), attaching or decoupling the display support to the plate 224 (FIG. 36E) as explained above, routing and securing a cord 678 to the support cart (FIG. 36F) and securing the upper portion of the trough, including the lid of the tray to the base portion. In addition, the support tubes 250 may be secured or decoupled from the side supports 204. If needed, the leg tubes may also be disconnected from the apex mounting bracket 216.

Although the present invention has been described with reference to preferred embodiments, those skilled in the art will recognize that changes may be made in form and detail without departing from the spirit and scope of the invention. As such, it is intended that the foregoing detailed description be regarded as illustrative rather than limiting and that it is the appended claims, including all equivalents thereof, which are intended to define the scope of the invention.

What is claimed is:

1. A support cart for a display comprising:
   a frame comprising a pair of spaced apart side supports each defining an apex;
   a plate disposed between the side supports and connected to the apices of the side supports, wherein the plate comprises a plurality of mounting locations configured to support a display, wherein the plate comprises a pair of upwardly opening receptacles defining at least in part the plurality of mounting locations and a pair of openings disposed above the receptacles;
   a pair of mounting members each comprising an insert portion received in one of the receptacles, wherein the mounting members are adapted to be coupled to a display;
   a mounting cross member having end portions received in the openings, wherein the cross member is adapted to be coupled to the display, and wherein lock members are engaged between the plate and the end portions of the cross member; and
   a tray positioned below the plate and extending between and connected to the side supports.

2. The support cart of claim 1 wherein the mounting cross member has a dog-bone shape.

3. The support cart of claim 1 wherein each of the side supports has an inverted V-shape comprising a pair of legs joined at the apex.

4. The support cart of claim 3 wherein the legs of each of the spaced apart side supports are joined by support tubes.

5. The support cart of claim 4 wherein the tray is carried by the support tubes.

6. The support cart of claim 1 further comprising at least one lock member engaged between the plate and one of the mounting members.

7. The support cart of claim 1 further comprising a display support, wherein the mounting members are coupled to the display support, and wherein the display support is adapted to be coupled to the display.

8. The support cart of claim 7 wherein the plate and display support have matching profiles.

9. A support cart for a display comprising:
   a frame comprising a pair of spaced apart side supports each defining an apex;
   a plate disposed between the side supports and connected to the apices of the side supports, wherein the plate comprises a plurality of mounting locations configured to support a display; and
   a tray positioned below the plate and extending between and connected to the side supports, wherein the tray comprises a central recessed cavity and a circumferential trough surrounding the cavity.

10. The support cart of claim 9 further comprising a lid pivotally coupled to the tray and moveable between a closed position, wherein the lid covers at least a portion of the cavity and trough, and an open position, wherein at least a portion of the cavity and trough are uncovered.

11. A support cart for a display comprising:
    a frame comprising a pair of spaced apart side supports each defining an apex, wherein each of the side supports has an inverted V-shape comprising a pair of legs joined at the apex, wherein the legs of each of the spaced apart side supports are joined by support tubes, wherein the leg comprises a leg tube, and wherein an end portion of the support tube is inserted through a side opening formed in the leg tube, and further comprising a wedge disposed in the leg tube, wherein the end portion of the support tube engages the wedge;
    a plate disposed between the side supports and connected to the apices of the side supports, wherein the plate comprises a plurality of mounting locations configured to support a display; and
    a tray positioned below the plate and extending between and connected to the side supports.

12. The support cart of claim 11 further comprising a fastener extending through the support tube and threadably engaging the wedge, wherein the fastener clamps the support tube to the leg tube.

13. The support cart of claim 12 wherein the wedge comprises a cylinder comprising first, second and third sectors, wherein a first opening is defined in the first and second sectors, and a second opening is defined in the third sector, wherein the second opening is coaxial with the first opening, wherein the fastener extends through the first opening and threadably engages the third sector at the second opening.

14. The support cart of claim 13 wherein the first opening comprises a shoulder defined at a bottom of the first opening, wherein the end portion of the support tube is engaged with the shoulder.

15. The support cart of claim 13 further comprising an 0-ring disposed around and binding the first, second and third sectors.

* * * * *